United States Patent
Kojima et al.

(10) Patent No.: US 9,502,056 B1
(45) Date of Patent: Nov. 22, 2016

(54) MAGNETORESISTANCE ELEMENT INCLUDING A STACK HAVING A SIDEWALL, AND AN INSULATING LAYER IN CONTACT WITH THE SIDEWALL

(71) Applicant: TDK CORPORATION, Tokyo (JP)

(72) Inventors: Hidekazu Kojima, Tokyo (JP); Takayasu Kanaya, Tokyo (JP); Hideyuki Ukita, Tokyo (JP); Minoru Ota, Tokyo (JP); Kohei Honma, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/082,992

(22) Filed: Mar. 28, 2016

(51) Int. Cl.
*G11B 5/39* (2006.01)

(52) U.S. Cl.
CPC .............. *G11B 5/3906* (2013.01); *G11B 5/39* (2013.01)

(58) Field of Classification Search
CPC ........... G11B 5/33; G11B 5/127; G11B 5/147; G11B 5/39
USPC ....................... 360/324.2, 324, 324.1, 324.12
See application file for complete search history.

(56) References Cited

U.S. PATENT DOCUMENTS

| | | | |
|---|---|---|---|
| 6,473,257 B1* | 10/2002 | Shimazawa ............ | B82Y 25/00 360/324.2 |
| 8,828,742 B2 | 9/2014 | Iba | |
| 9,030,784 B2 | 5/2015 | Li et al. | |
| 2002/0044396 A1* | 4/2002 | Amano .................. | B82Y 10/00 360/324.2 |
| 2003/0235016 A1* | 12/2003 | Gill ...................... | G11B 5/3903 360/324.12 |

\* cited by examiner

*Primary Examiner* — Allen T Cao
(74) *Attorney, Agent, or Firm* — Oliff PLC

(57) ABSTRACT

A TMR element includes a stack having a sidewall, and an insulating layer in contact with the sidewall. The stack includes a first ferromagnetic layer, a second ferromagnetic layer, and a tunnel barrier layer located between the first and second ferromagnetic layers. The insulating layer includes an island-like structure section in contact with only a part of the sidewall, and a coating section covering the island-like structure section and the sidewall. The tunnel barrier layer contains a first oxide. The island-like structure section contains a second oxide. Each of the first and second oxides is a metal oxide or semiconductor oxide. G2−G1 is 435 kJ/mol or smaller, where G1 and G2 are standard Gibbs energies of formation at 280° C. of the first oxide and the second oxide, respectively.

6 Claims, 21 Drawing Sheets

MAGNETORESISTANCE ELEMENT INCLUDING A STACK HAVING A SIDEWALL, AND AN INSULATING LAYER IN CONTACT WITH THE SIDEWALL

BACKGROUND OF THE INVENTION

1. Field of the Invention

The present invention relates to a magnetoresistance element, and to a thin-film magnetic head, a head assembly and a magnetic recording drive each including the magnetoresistance element.

2. Description of the Related Art

With recent improvements in recording density of magnetic recording devices such as magnetic disk drives, there has been a demand for improving the performance of thin-film magnetic heads. Among the thin-film magnetic heads, a composite thin-film magnetic head has been used widely. The composite thin-film magnetic head has a structure in which a read head unit including a magnetoresistance element (hereinafter, also referred to as MR element) for reading and a write head unit including an induction-type electromagnetic transducer for writing are stacked on a substrate. Each thin-film magnetic head has a medium facing surface to face a recording medium.

An example of MR elements that can achieve high sensitivity and high output is a TMR element which uses the tunneling magnetoresistance effect. The TMR element typically includes a free layer, a pinned layer, a tunnel barrier layer located between the free layer and the pinned layer, and an antiferromagnetic layer located on a side of the pinned layer opposite from the tunnel barrier layer. The free layer is a ferromagnetic layer whose magnetization direction changes in response to a signal magnetic field. The pinned layer is a ferromagnetic layer whose magnetization direction is pinned. The antiferromagnetic layer is to pin the magnetization direction of the pinned layer by means of exchange coupling with the pinned layer. The tunnel barrier layer is typically formed of an insulating material such as aluminum oxide ($Al_2O_3$) or magnesium oxide (MgO).

Now, an example of the configuration of a read head unit incorporating a TMR element will be described. The read head unit includes a first electrode, a second electrode, and a TMR element. The TMR element is located near the medium facing surface and detects a signal magnetic field from a recording medium. The first and second electrodes are located on opposite sides of the TMR element in the direction in which a plurality of layers constituting the TMR element are stacked. The first and second electrodes feed the TMR element a sense current for detecting a signal corresponding to the signal magnetic field. The sense current flows in a direction intersecting the plane of the layers constituting the TMR element, such as a direction perpendicular to the plane of the layers constituting the TMR element.

The TMR element includes a stack including the free layer, the tunnel barrier layer, the pinned layer and the antiferromagnetic layer mentioned above. The stack has a front end face located in the medium facing surface, a rear end face located opposite to the front end face, and first and second sidewalls located at opposite ends of the stack in the track width direction. The TMR element further includes a first insulating layer in contact with the first sidewall, and a second insulating layer in contact with the second sidewall.

The read head unit further includes first and second bias magnetic field applying layers located on opposite sides of the stack in the track width direction. At least part of the first insulating layer is interposed between the first sidewall and the first bias magnetic field applying layer. At least part of the second insulating layer is interposed between the second sidewall and the second bias magnetic field applying layer. The read head unit further includes an insulating refill layer provided around the stack, the first and second insulating layers and the first and second bias magnetic field applying layers.

The first and second bias magnetic field applying layers apply to the TMR element a bias magnetic field for orienting the magnetization of the free layer in a predetermined direction when no signal magnetic field is applied to the TMR element.

The read head unit having the above-described configuration is disclosed in, for example, U.S. Pat. No. 9,030,784 B2.

An example of a manufacturing method for the read head unit will now be described. The manufacturing method starts with forming on the first electrode a layered film that later becomes the aforementioned stack. The layered film is composed of a plurality of layers stacked on each other. Then, the layered film is etched using a first mask to thereby provide the layered film with the aforementioned first and second sidewalls. Next, the first and second insulating films and the first and second bias magnetic field applying layers are formed in succession, and the first mask is removed. The layered film is then etched using a second mask to thereby provide the layered film with the aforementioned rear end face. The layered film thereby becomes an initial stack. The initial stack has the first and second sidewalls and the rear end face, but does not have the front end face yet. Next, the insulating refill layer is formed and the second mask is removed. The second electrode is then formed on the initial stack. A manufacturing method for a magnetic head including the read head unit includes the step of forming the medium facing surface. In the step of forming the medium facing surface, the initial stack is provided with the front end face and thereby becomes the aforementioned stack.

According to the manufacturing method for the read head unit described above, during the step of etching the layered film to form the first and second sidewalls, flying substances generated by the etching of the layered film may adhere to the first and second sidewalls to form an adhesion film on each of the first and second sidewalls. If the adhesion film is formed of metal, the free layer and the pinned layer can be short-circuited via the adhesion film. If the free layer and the pinned layer are short-circuited via the adhesion film, there arises the problem of a reduction in the magnetoresistance change ratio of the TMR element.

It is difficult to completely eliminate the adhesion film by adjusting the etching conditions in the step of etching the layered film to form the first and second sidewalls.

In order to prevent the free layer and the pinned layer from being short-circuited via the adhesion film, U.S. Pat. No. 8,828,742 B2 discloses the technique to form an insulating metal oxide layer by oxidizing the adhesion film of metal formed on the first and second sidewalls.

In the process of manufacturing a magnetic head, a step following the formation of the initial stack, such as the step of fabricating an induction-type electromagnetic transducer, may include heat treatment at temperatures of around 200° C. to 300° C. Suppose that the adhesion film of metal formed on the first and second sidewalls is oxidized to form a metal oxide layer in the step of forming the initial stack. In such a case, if the foregoing heat treatment is performed after the formation of the initial stack, the metal oxide layer can undergo a reduction reaction and change into a metal layer.

This gives rise to the problem that the free layer and the pinned layer are short-circuited via the metal layer to reduce the magnetoresistance change ratio of the TMR element.

OBJECT AND SUMMARY OF THE INVENTION

It is an object of the present invention to provide a magnetoresistance element capable of preventing a reduction in magnetoresistance change ratio resulting from heat treatment, and to provide a thin-film magnetic head, a head assembly and a magnetic recording drive each including the magnetoresistance element.

A magnetoresistance element of the present invention includes: a stack having at least one sidewall; and at least one insulating layer in contact with the at least one sidewall. The stack includes a first ferromagnetic layer, a second ferromagnetic layer, and a tunnel barrier layer located between the first ferromagnetic layer and the second ferromagnetic layer. The tunnel barrier layer has at least one end face located in the at least one sidewall of the stack. The at least one insulating layer includes: an island-like structure section in contact with only a part of the at least one sidewall; and a coating section covering the island-like structure section and the at least one sidewall.

The tunnel barrier layer contains a first oxide. The island-like structure section contains a second oxide. The coating section contains a third oxide. Each of the first to third oxides is a metal oxide or semiconductor oxide. Let G1 (kJ/mol), G2 (kJ/mol) and G3 (kJ/mol) represent standard Gibbs energies of formation at 280° C. of the first oxide, the second oxide and the third oxide, respectively. G2–G1 is greater than 0 (kJ/mol) and smaller than or equal to 435 (kJ/mol). G2–G3 is greater than 0 (kJ/mol) and smaller than or equal to 435 (kJ/mol). G3–G1 is smaller than or equal to 435 (kJ/mol).

In the magnetoresistance element of the present invention, the first ferromagnetic layer may be a free layer whose magnetization direction changes in response to an external magnetic field, while the second ferromagnetic layer may be a pinned layer whose magnetization direction is pinned.

A thin-film magnetic head of the present invention includes: a medium facing surface to face a recording medium; and the magnetoresistance element of the invention. The magnetoresistance element is configured to detect a signal magnetic field from the recording medium.

The thin-film magnetic head of the present invention may further include: first and second electrodes for feeding the magnetoresistance element a current for detecting a signal corresponding to the signal magnetic field; and first and second bias magnetic field applying layers for applying a bias magnetic field to the magnetoresistance element. The first and second electrodes are located on opposite sides of the stack in a direction in which the first ferromagnetic layer, the tunnel barrier layer and the second ferromagnetic layer are stacked. In this case, the at least one sidewall of the stack may be a first sidewall and a second sidewall located at opposite ends of at least part of the stack in the track width direction. The at least one end face of the tunnel barrier layer may be a first end face and a second end face located in the first sidewall and the second sidewall, respectively. The at least one insulating layer may be a first insulating layer and a second insulating layer in contact with the first sidewall and the second sidewall, respectively. The first and second bias magnetic field applying layers are located on opposite sides of the at least part of the stack in the track width direction. At least part of the first insulating layer is interposed between the first sidewall and the first bias magnetic field applying layer. At least part of the second insulating layer is interposed between the second sidewall and the second bias magnetic field applying layer.

A head assembly of the present invention includes: a slider disposed to face a recording medium; and a supporter flexibly supporting the slider. The slider includes a thin-film magnetic head. The thin-film magnetic head includes: a medium facing surface to face the recording medium; and the magnetoresistance element of the invention. The magnetoresistance element is configured to detect a signal magnetic field from the recording medium.

A magnetic recording device of the present invention includes a recording medium, a thin-film magnetic head, and a positioning device supporting the thin-film magnetic head and positioning the thin-film magnetic head with respect to the recording medium. The thin-film magnetic head includes: a medium facing surface facing the recording medium; and the magnetoresistance element of the invention. The magnetoresistance element is configured to detect a signal magnetic field from the recording medium.

In the present invention, the at least one insulating layer in contact with the at least one sidewall of the stack includes the island-like structure section and the coating section. Further, in the present invention, G1, G2 and G3 defined as above have the predetermined relationships with each other described above. By virtue of these features, the present invention makes it possible to prevent a reduction in the magnetoresistance change ratio of the magnetoresistance element resulting from heat treatment.

Other and further objects, features and advantages of the present invention will appear more fully from the following description.

DETAILED DESCRIPTION OF THE PREFERRED EMBODIMENT

Figure 6:
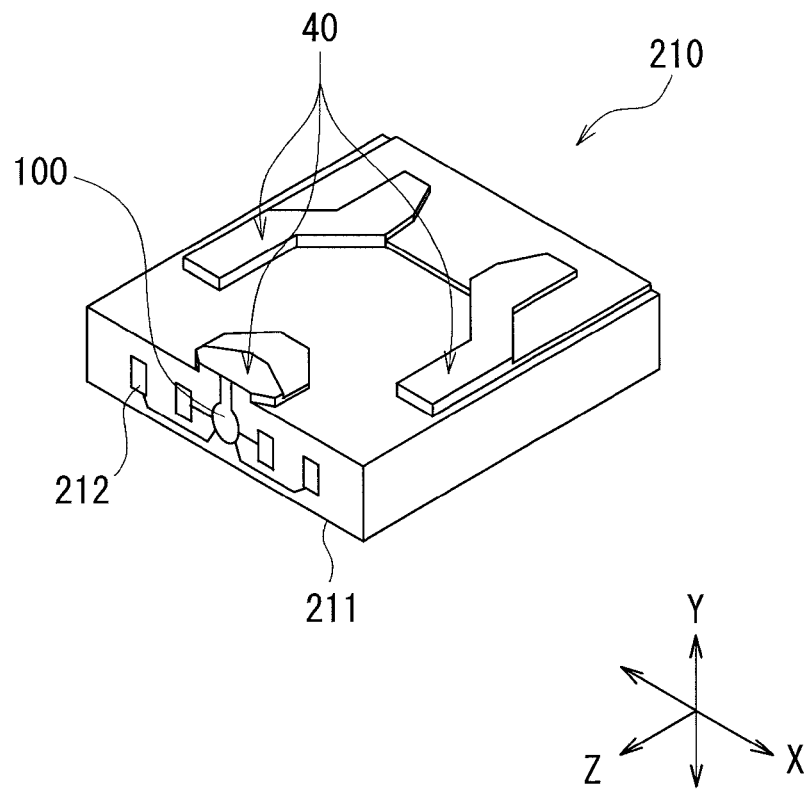
FIG. 6 is a perspective view showing a slider including the magnetic head according to the embodiment of the invention.

An embodiment of the present invention will now be described in detail with reference to the drawings. First, reference is made to FIG. 6 to describe a slider 210 including a thin-film magnetic head (hereinafter, simply referred to as magnetic head) according to the embodiment of the invention. The magnetic head according to the embodiment is for use in perpendicular magnetic recording. In a magnetic recording device, the slider 210 is disposed to face a circular-plate-shaped recording medium (a magnetic disk) that is driven to rotate. In FIG. 6, the X direction is a direction across the tracks of the recording medium, i.e., the track width direction; the Y direction is a direction perpendicular to the surface of the recording medium; and the Z direction is the direction of travel of the recording medium when viewed from the slider 210. The X, Y, and Z directions are orthogonal to one another. The slider 210 has a base body 211. The base body 211 is generally hexahedron-shaped. One of the six surfaces of the base body 211 is designed to face the surface of the recording medium. At this one of the six surfaces, there is formed a medium facing surface 40 to face the recording medium. When the recording medium rotates and travels in the Z direction, an airflow passing between the recording medium and the slider 210 causes a lift below the slider 210 in the Y direction in FIG. 6. The lift causes the slider 210 to fly over the surface of the recording medium. The magnetic head 100 according to the embodiment is formed near the air-outflow-side end (the end in the Z direction) of the slider 210. A plurality of terminals 212 are also provided at the air-outflow-side end of the slider 210.

A head assembly according to the embodiment will now be described with reference to FIG. 7. The head assembly according to the embodiment includes the slider 210 shown in FIG. 6 and a supporter that flexibly supports the slider 210. Forms of the head assembly include a head gimbal assembly and a head arm assembly described below.

The head gimbal assembly 220 will be described first. The head gimbal assembly 220 includes the slider 210, and a suspension 221 serving as the supporter that flexibly supports the slider 210. The suspension 221 includes: a plate-spring-shaped load beam 222 formed of, e.g., stainless steel; a flexure 223 to which the slider 210 is joined, the flexure 223 being provided at an end of the load beam 222 and giving an appropriate degree of freedom to the slider 210; and a base plate 224 provided at the other end of the load beam 222. The base plate 224 is configured to be attached to an arm 230 of an actuator for moving the slider 210 along the X direction across the tracks of the recording medium 262. The actuator has the arm 230 and a voice coil motor that drives the arm 230. A gimbal section for maintaining the orientation of the slider 210 is provided in the portion of the flexure 223 on which the slider 210 is mounted.

The head gimbal assembly 220 is attached to the arm 230 of the actuator. An assembly including the arm 230 and the head gimbal assembly 220 attached to the arm 230 is called a head arm assembly. An assembly including a carriage having a plurality of arms with a plurality of head gimbal assemblies 220 respectively attached to the arms is called a head stack assembly.

Figure 7:
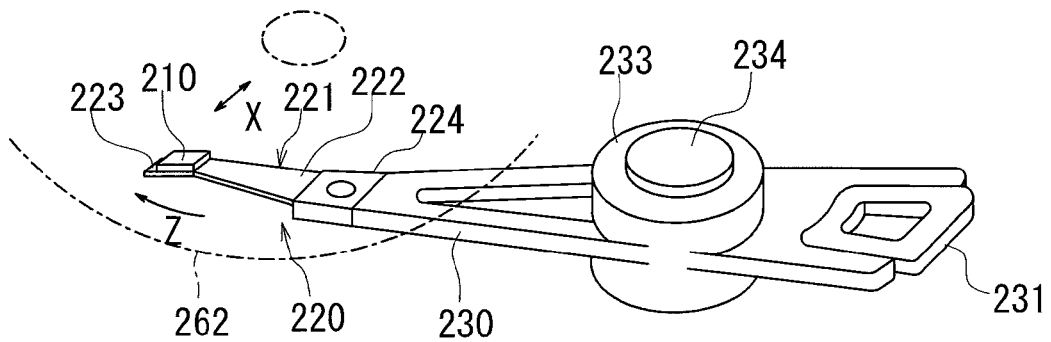
FIG. 7 is a perspective view showing a head arm assembly according to the embodiment of the invention.

FIG. 7 shows the head arm assembly according to the embodiment. In the head arm assembly, the head gimbal assembly 220 is attached to an end of the arm 230. A coil 231 that forms part of the voice coil motor is fixed to the other end of the arm 230. A bearing 233 is provided in the middle of the arm 230. The bearing 233 is attached to a shaft 234 for rotatably supporting the arm 230.

Figure 8:
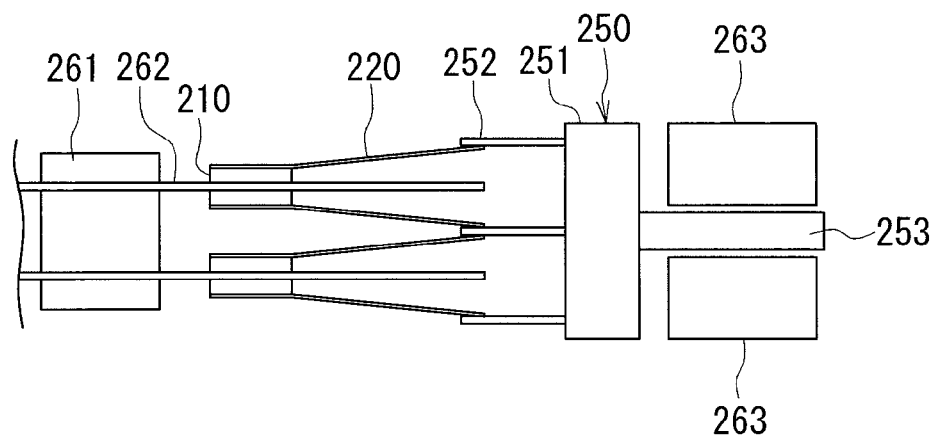
FIG. 8 is an explanatory diagram for illustrating the main part of a magnetic recording device according to the embodiment of the invention.
Figure 9:
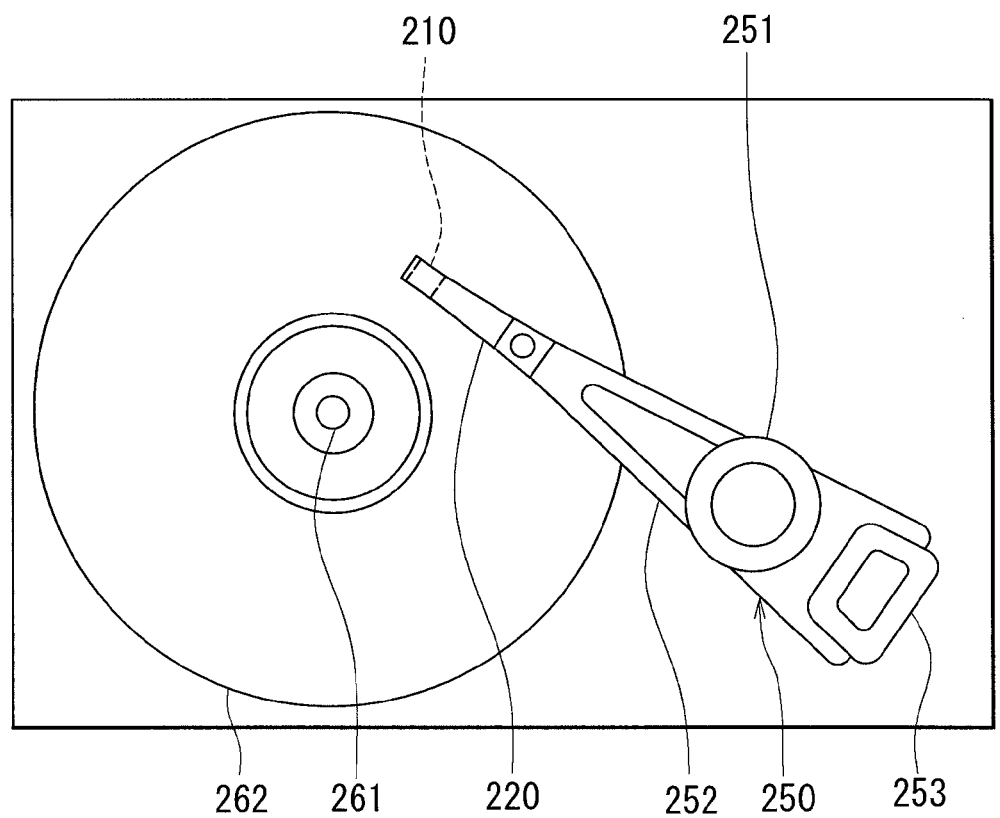
FIG. 9 is a plan view of the magnetic recording device according to the embodiment of the invention.

Reference is now made to FIG. 8 and FIG. 9 to describe an example of the head stack assembly and a magnetic recording device according to the embodiment. FIG. 8 is an explanatory diagram showing the main part of the magnetic recording device. FIG. 9 is a plan view of the magnetic recording device. The head stack assembly 250 includes a carriage 251 having a plurality of arms 252. A plurality of head gimbal assemblies 220 are attached to the arms 252 such that the assemblies 220 are aligned in the vertical direction with spacing between every adjacent ones. A coil 253 forming part of the voice coil motor is mounted on a side of the carriage 251 opposite from the arms 252. The head stack assembly 250 is installed in the magnetic recording device. The magnetic recording device includes a plurality of recording media 262 mounted on a spindle motor 261. Two sliders 210 are allocated to each recording medium 262 such that the two sliders 210 are opposed to each other with the recording medium 262 interposed therebetween. The voice coil motor includes permanent magnets 263 arranged to be opposed to each other with the coil 253 of the head stack assembly 250 interposed therebetween. The actuator and the head stack assembly 250 except the sliders 210 support the sliders 210 and position them with respect to the recording media 262. Note that the magnetic recording device of the present invention may be configured otherwise than the above-described configuration. For example, the magnetic recording device of the present invention may be provided with a single recording medium 262 and one or two head gimbal assemblies 220.

In the magnetic recording device according to the embodiment, the actuator moves the slider 210 across the tracks of the recording medium 262 and positions the slider 210 with respect to the recording medium 262. The slider 210 includes the magnetic head 100. The magnetic head 100 includes a write head unit and a read head unit. The magnetic head 100 writes data on the recording medium 262 with the write head unit, and reads data stored on the recording medium 262 with the read head unit.

Figure 3:
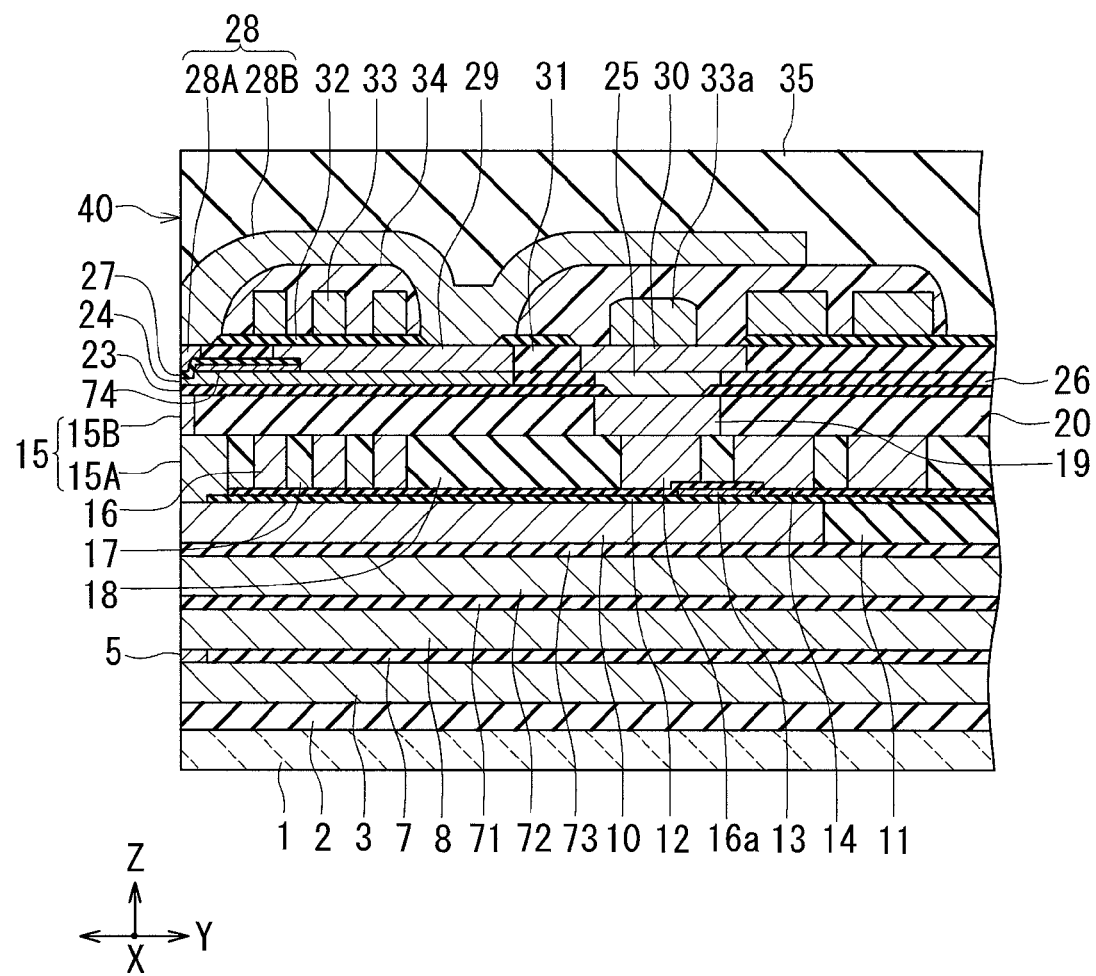
FIG. 3 is a cross-sectional view showing the configuration of a magnetic head according to an embodiment of the invention.
Figure 4:
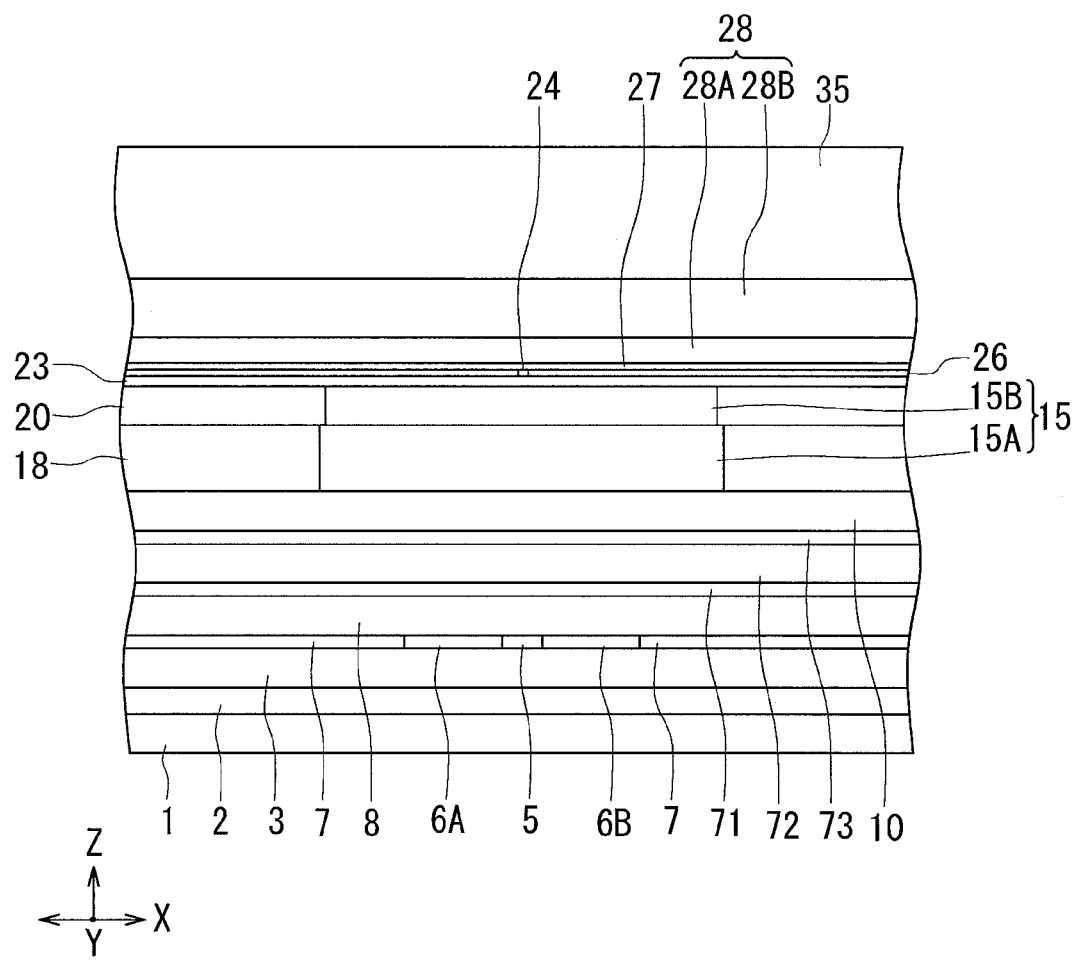
FIG. 4 is a front view showing the medium facing surface of the magnetic head according to the embodiment of the invention.

An example of the configuration of the magnetic head according to the embodiment will now be described with reference to FIG. 3 and FIG. 4. The magnetic head shown in FIG. 3 and FIG. 4 is one whose read head unit is of a first configuration example to be described later. FIG. 3 is a cross-sectional view showing the configuration of the magnetic head. FIG. 4 is a front view showing the medium facing surface of the magnetic head. Note that FIG. 3 shows a cross section perpendicular to the medium facing surface and to the top surface of the substrate. The X, Y, and Z directions shown in FIG. 6 are also shown in FIG. 3 and FIG. 4. In FIG. 3, the X direction is orthogonal to the Y and Z directions. In FIG. 4, the Y direction is orthogonal to the X and Z directions.

As shown in FIG. 3, the magnetic head according to the embodiment has the medium facing surface 40 to face the recording medium. As shown in FIG. 3 and FIG. 4, the magnetic head includes: a substrate 1 formed of a ceramic material such as aluminum oxide-titanium carbide ($Al_2O_3$—TiC); an insulating layer 2 formed of an insulating material such as alumina ($Al_2O_3$) and lying on the substrate 1; a first electrode 3 lying on the insulating layer 2; a magnetoresistance element (hereinafter referred to as MR element) 5 lying on the first electrode 3; a first bias magnetic field applying layer 6A and a second bias magnetic field applying layer 6B located on opposite sides of the MR element 5 in the track width direction (the X direction in FIG. 4); an insulating refill layer 7 disposed around the MR element 5 and the bias magnetic field applying layers 6A and 6B; and a second electrode 8 lying on the MR element 5, the bias magnetic field applying layers 6A and 6B and the insulating refill layer 7. The parts from the first electrode 3 to the second electrode 8 constitute the read head unit of the first configuration example. The read head unit of the first configuration example will be described in detail later.

The magnetic head further includes: an insulating layer 71 lying on the second electrode 8; a middle shield layer 72 formed of a magnetic material and lying on the insulating layer 71; a nonmagnetic layer 73 lying on the middle shield layer 72; a sub-shield 10 formed of a magnetic material and lying on the nonmagnetic layer 73; and an insulating layer 11 disposed around the sub-shield 10. The insulating layers 71 and 11 and the nonmagnetic layer 73 are formed of alumina, for example. The sub-shield 10 has an end face located in the medium facing surface 40. The top surfaces of the sub-shield 10 and the insulating layer 11 are even with each other.

The magnetic head further includes an insulating film 12 lying on the sub-shield 10 and the insulating layer 11, a heater 13 lying on the insulating film 12, and an insulating film 14 lying on the insulating film 12 and the heater 13 with the heater 13 interposed between the insulating films 12 and 14. The function and material of the heater 13 will be described later. The insulating films 12 and 14 are each formed of an insulating material such as alumina.

The magnetic head further includes a first write shield 15 lying on the sub-shield 10. The first write shield 15 includes a first layer 15A lying on the sub-shield 10 and a second layer 15B lying on the first layer 15A. The first layer 15A and the second layer 15B are each formed of a magnetic material. Each of the first layer 15A and the second layer 15B has an end face located in the medium facing surface 40.

The magnetic head further includes: a coil 16 formed of a conductive material and lying on the insulating film 14; an insulating layer 17 filling the space between the coil 16 and the first layer 15A and the space between every adjacent turns of the coil 16; and an insulating layer 18 disposed around the first layer 15A, the coil 16 and the insulating layer 17. The coil 16 is planar spiral-shaped. The coil 16 includes a connecting portion 16a which is a portion near the inner end of the coil 16 and connected to another coil described later. The insulating layer 17 is formed of a photoresist, for example. The insulating layer 18 is formed of alumina, for example. The top surfaces of the first layer 15A, the coil 16 and the insulating layers 17 and 18 are even with each other.

The magnetic head further includes a connecting layer 19 formed of a conductive material and lying on the connecting portion 16a, and an insulating layer 20 formed of an insulating material such as alumina and disposed around the second layer 15B and the connecting layer 19. The connecting layer 19 may be formed of the same material as that of the second layer 15B. The top surfaces of the second layer 15B, the connecting layer 19, and the insulating layer 20 are even with each other.

The magnetic head further includes a first gap layer 23 lying on the second layer 15B, the connecting layer 19 and the insulating layer 20. The first gap layer 23 has an opening formed in the area corresponding to the top surface of the connecting layer 19. The first gap layer 23 is formed of a nonmagnetic insulating material such as alumina.

The magnetic head further includes a pole layer 24 formed of a magnetic material and lying on the first gap layer 23, a connecting layer 25 formed of a conductive material and lying on the connecting layer 19, and an insulating layer 26 formed of an insulating material such as alumina and disposed around the pole layer 24 and the connecting layer 25. The pole layer 24 has an end face located in the medium facing surface 40. The connecting layer 25 is connected to the connecting layer 19 through the opening of the first gap layer 23. The connecting layer 25 may be formed of the same material as that of the pole layer 24.

The magnetic head further includes a nonmagnetic layer 74 formed of a nonmagnetic material and lying on part of the top surface of the pole layer 24. The nonmagnetic layer 74 is formed of an inorganic insulating material or a metal material, for example. Examples of the inorganic insulating material to be used for the nonmagnetic layer 74 include alumina and $SiO_2$. Examples of the metal material to be used for the nonmagnetic layer 74 include Ru and Ti.

The magnetic head further includes a second gap layer 27 lying on a part of the pole layer 24 and the nonmagnetic layer 74. The nonmagnetic layer 74 and the second gap layer 27 cover neither of the top surface of the connecting layer 25 and a part of the top surface of the pole layer 24 located away from the medium facing surface 40. The second gap layer 27 is formed of a nonmagnetic material such as alumina.

The magnetic head further includes a second write shield 28 lying on the second gap layer 27. The second write shield 28 includes a first layer 28A disposed to adjoin the second gap layer 27, and a second layer 28B lying on a side of the first layer 28A opposite from the second gap layer 27 and connected to the first layer 28A. The first layer 28A and the second layer 28B are each formed of a magnetic material. Each of the first layer 28A and the second layer 28B has an end face located in the medium facing surface 40.

The magnetic head further includes: a yoke layer 29 formed of a magnetic material, located away from the medium facing surface 40 and lying on the pole layer 24; a connecting layer 30 formed of a conductive material and lying on the connecting layer 25; and an insulating layer 31 formed of an insulating material such as alumina and disposed around the first layer 28A, the yoke layer 29 and the connecting layer 30. The yoke layer 29 and the connecting layer 30 may be formed of the same material as that of the first layer 28A. The top surfaces of the first layer 28A, the yoke layer 29, the connecting layer 30 and the insulating layer 31 are even with each other.

The magnetic head further includes an insulating layer 32 formed of an insulating material such as alumina and lying on the yoke layer 29 and the insulating layer 31. The insulating layer 32 has an opening for exposing the top surface of the first layer 28A, an opening for exposing a part of the top surface of the yoke layer 29 near an end thereof farther from the medium facing surface 40, and an opening for exposing the top surface of the connecting layer 30.

The magnetic head further includes a coil 33 formed of a conductive material and lying on the insulating layer 32. The coil 33 is planar spiral-shaped. The coil 33 includes a connecting portion 33a which is a portion near the inner end of the coil 33 and connected to the connecting portion 16a of the coil 16. The connecting portion 33a is connected to the connecting layer 30, and is connected to the connecting portion 16a via the connecting layers 19, 25, and 30.

The magnetic head further includes an insulating layer 34 disposed to cover the coil 33. The insulating layer 34 is formed of a photoresist, for example. The second layer 28B of the second write shield 28 lies on the first layer 28A, the yoke layer 29 and the insulating layer 34, and connects the first layer 28A and the yoke layer 29.

The magnetic head further includes an overcoat layer 35 formed of an insulating material such as alumina and disposed to cover the second layer 28B. The parts from the sub-shield 10 to the second layer 28B constitute the write head unit. The base body 211 shown in FIG. 6 is mainly composed of the substrate 1 and the overcoat layer 35 shown in FIG. 3 and FIG. 4.

As has been described, the magnetic head according to the embodiment has the medium facing surface 40, the read head unit, and the write head unit. The read head unit and the write head unit are stacked on the substrate 1. The read head unit is located on the rear side in the direction of travel of the recording medium (the Z direction), i.e., located on the air-inflow-end side of the slider, relative to the write head unit. The magnetic head writes data on the recording medium with the write head unit, and reads data stored on the recording medium with the read head unit.

The write head unit includes the sub-shield 10, the first write shield 15, the coil 16, the first gap layer 23, the pole layer 24, the nonmagnetic layer 74, the second gap layer 27, the second write shield 28, the yoke layer 29, and the coil 33. The coils 16 and 33 produce magnetic fields corresponding to data to be written on the recording medium. The pole layer 24, the second write shield 28, and the yoke layer 29 form a magnetic path for passing a magnetic flux corresponding to the magnetic field produced by the coil 33. The pole layer 24 has an end face located in the medium facing surface 40, allows the magnetic flux corresponding to the magnetic field produced by the coil 33 to pass, and produces a write magnetic field for use to write data on the recording medium by means of a perpendicular magnetic recording system.

The first write shield 15 captures a magnetic flux produced from the end face of the pole layer 24 located in the medium facing surface 40 and spreading in directions other than the direction perpendicular to the plane of the recording medium, and thereby prevents the magnetic flux from reaching the recording medium. It is thereby possible to improve the recording density. The sub-shield 10 has the function of allowing a magnetic flux that has been produced from the end face of the pole layer 24 and has magnetized the recording medium to flow back. The sub-shield 10 may be connected to a part of the pole layer 24 located away from the medium facing surface 40.

The second write shield 28 captures a magnetic flux produced from the end face of the pole layer 24 located in the medium facing surface 40 and spreading in directions other than the direction perpendicular to the plane of the recording medium, and thereby prevents the magnetic flux from reaching the recording medium. It is thereby possible to improve the recording density. Further, the second write shield 28 captures a disturbance magnetic field applied to the magnetic head from the outside thereof. This prevents the disturbance magnetic field from being intensively captured into the pole layer 24 and inducing erroneous writing on the recording medium. Moreover, the second write shield 28 has the function of allowing a magnetic flux that has been produced from the end face of the pole layer 24 and has magnetized the recording medium to flow back.

The function and material of the heater 13 will now be described. The heater 13 is provided for heating the components of the write head unit including the pole layer 24 so as to adjust the distance between the recording medium and the end face of the pole layer 24 located in the medium facing surface 40. Two leads, which are not illustrated, are connected to the heater 13. The heater 13 is formed of, for example, an NiCr film or a layered film composed of a Ta film, an NiCu film and a Ta film. The heater 13 is energized through the two leads and generates heat, thereby heating the components of the write head unit. This causes the components of the write head unit to expand, so that the end face of the pole layer 24 located in the medium facing surface 40 becomes closer to the recording medium.

While FIG. 3 and FIG. 4 show a write head unit for use in the perpendicular magnetic recording system, the write head unit of the embodiment may be one for use in the longitudinal magnetic recording system.

Figure 1:
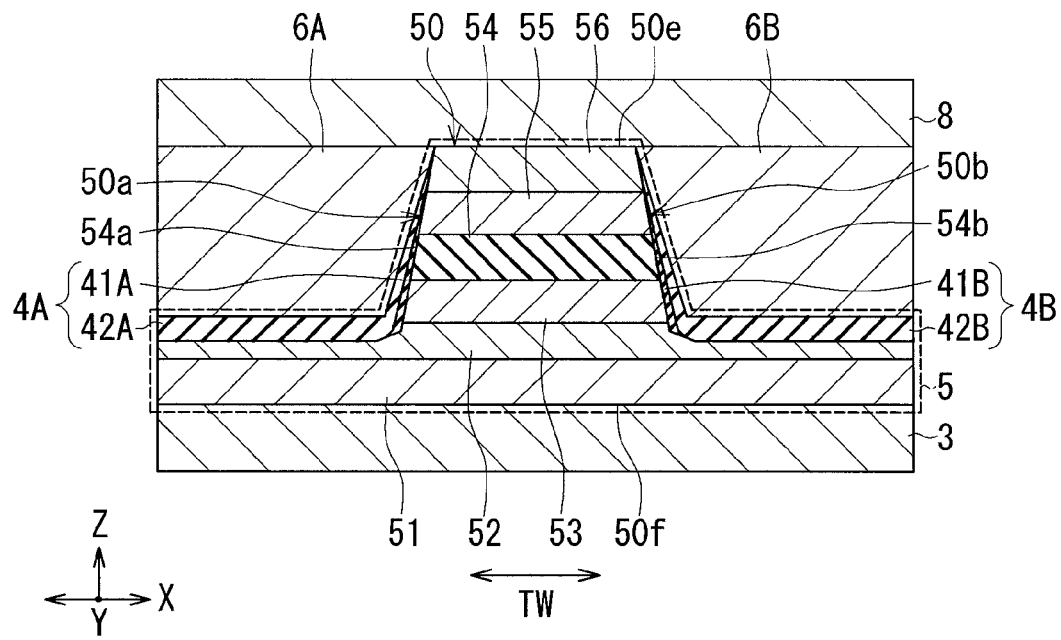
FIG. 1 is a cross-sectional view showing a cross section of a read head unit of a first configuration example parallel to the medium facing surface.
Figure 2:
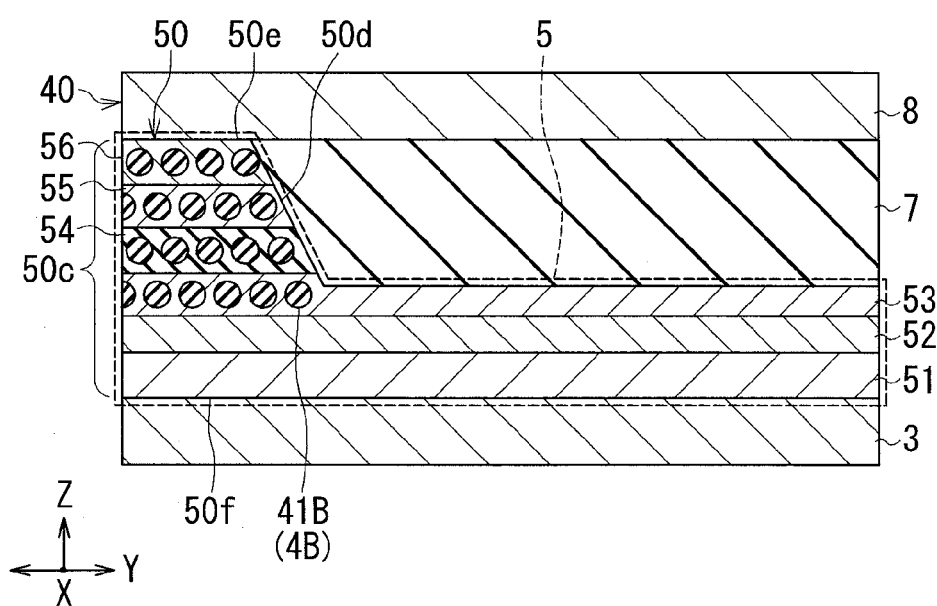
FIG. 2 is a cross-sectional view showing a cross section of the read head unit of the first configuration example perpendicular to the medium facing surface and to a top surface of a substrate.

Now, the read head unit of the first configuration example will be described in detail with reference to FIG. 1 and FIG. 2. FIG. 1 is a cross-sectional view showing a cross section of the read head unit parallel to the medium facing surface 40. FIG. 2 is a cross-sectional view showing a cross section of the read head unit perpendicular to the medium facing surface 40 and to the top surface of the substrate 1. The X, Y, and Z directions shown in FIG. 6 are also shown in FIG. 1 and FIG. 2. In FIG. 1, the Y direction is orthogonal to the X and Z directions. In FIG. 2, the X direction is orthogonal to the Y and Z directions. The arrow with the symbol TW in FIG. 1 indicates the track width direction. The track width direction TW is the same as the X direction.

The read head unit includes the MR element 5 according to the embodiment. In the embodiment, the MR element 5 is a TMR element which uses the tunneling magnetoresistance effect. In the following descriptions, the MR element 5 will be referred to as TMR element 5.

The TMR element 5 includes a stack 50 having at least one sidewall. In the embodiment, the at least one sidewall of the stack 50 is a first sidewall 50a and a second sidewall 50b located at opposite ends of at least part of the stack 50 in the track width direction TW. The stack 50 further has: a front end face 50c located in the medium facing surface 40; a rear end face 50d opposite to the front end face 50c; a top surface 50e; and a bottom surface 50f. In the example shown in FIG. 1, the first and second sidewalls 50a and 50b are inclined such that the distance therebetween increases toward the bottom surface 50f.

The stack 50 includes a first ferromagnetic layer, a second ferromagnetic layer, and a tunnel barrier layer 54 located between the first and second ferromagnetic layers. In the embodiment, the first ferromagnetic layer is a free layer whose magnetization direction changes in response to an external magnetic field, while the second ferromagnetic layer is a pinned layer whose magnetization direction is pinned. Hereinafter, reference numerals 55 and 53 will be used to represent the free layer and the pinned layer, respectively. The pinned layer 53 is located between the bottom surface 50f and the tunnel barrier layer 54. The free layer 55 is located between the top surface 50e and the tunnel barrier layer 54.

The stack 50 further includes an antiferromagnetic layer 52, an underlayer 51 and a cap layer 56. The antiferromagnetic layer 52 is located on a side of the pinned layer 53 opposite from the tunnel barrier layer 54. In the stack 50 shown in FIG. 1 and FIG. 2, the underlayer 51, the antiferromagnetic layer 52, the pinned layer 53, the tunnel barrier layer 54, the free layer 55 and the cap layer 56 are stacked in this order from the bottom surface 50f side.

The antiferromagnetic layer 52 is to pin the magnetization direction of the pinned layer 53 by means of exchange coupling with the pinned layer 53. The magnetization direction of the pinned layer 53 is pinned by exchange coupling between the pinned layer 53 and the antiferromagnetic layer 52 at the interface therebetween. The underlayer 51 is intended for improving the crystallinity and orientability of the layers to be formed thereon and for enhancing the exchange coupling between the antiferromagnetic layer 52 and the pinned layer 53, in particular. The cap layer 56 is provided for protecting the layers located thereunder. The total thickness of the layers 51 to 56 is in the range of 20 to 30 nm, for example.

As previously mentioned, the first and second sidewalls 50a and 50b are located at opposite ends of at least part of the stack 50 in the track width direction TW. The at least part of the stack 50 includes at least the tunnel barrier layer 54.

In the example shown in FIG. 1, a part of the stack 50 that extends from the cap layer 56 part-way through the antiferromagnetic layer 52 corresponds to the at least part of the stack 50. In this example, the first and second sidewalls 50a and 50b are formed to extend from the cap layer 56 to the antiferromagnetic layer 52. The at least part of the stack 50 may be a part of the stack 50 that extends from the cap layer 56 at least part-way through the pinned layer 53. In this case, the first and second sidewalls 50a and 50b are formed to extend from the cap layer 56 to the pinned layer 53. Alternatively, the at least part of the stack 50 may be a part of the stack 50 that extends from the cap layer 56 at least part-way through the underlayer 51. In this case, the first and second sidewalls 50a and 50b are formed to extend from the cap layer 56 to the underlayer 51.

The tunnel barrier layer 54 has at least one end face located in the at least one sidewall of the stack 50. In the embodiment, the at least one end face of the tunnel barrier layer 54 is a first end face 54a and a second end face 54b located in the first sidewall 50a and the second sidewall 50b, respectively.

The TMR element 5 further includes at least one insulating layer in contact with the at least one sidewall of the stack 50. The at least one insulating layer includes an island-like structure section in contact with only a part of the at least one sidewall, and a coating section covering the island-like structure section and the at least one sidewall. In the embodiment, the at least one insulating layer is a first insulating layer 4A and a second insulating layer 4B in contact with the first sidewall 50a and the second sidewall 50b, respectively. The first insulating layer 4A includes an island-like structure section 41A in contact with only a part of the first sidewall 50a, and a coating section 42A covering the island-like structure section 41A and the first sidewall 50a. The second insulating layer 4B includes an island-like structure section 41A in contact with only a part of the second sidewall 50b, and a coating section 42B covering the island-like structure section 41B and the second sidewall 50b.

FIG. 2 shows a cross section of the stack 50 as viewed from the second sidewall 50b. FIG. 2 also shows the island-like structure section 41B. In FIG. 2, the island-like structure section 41B is shown in a cross section parallel to the second sidewall 50b and intersecting the island-like structure section 41B. Any figures similar to FIG. 2, to be referred to for descriptions below, will also employ the same way of representation as in FIG. 2.

As shown in FIG. 2, the island-like structure section 41B is an aggregate of a plurality of mutually isolated components. In FIG. 2, for the sake of convenience, the plurality of components of the island-like structure section 41B are represented by using a plurality of regularly arranged circles. However, the plurality of components of the island-like structure section 41B may be irregular in shape and/or arrangement. Although not illustrated, the island-like structure section 41A is also an aggregate of a plurality of mutually isolated components like the island-like structure section 41B.

The TMR element 5 is configured to detect a signal magnetic field from the recording medium, as described below. The read head unit further includes the first and second electrodes 3 and 8. The first and second electrodes 3 and 8 are located on opposite sides of the stack 50 in the direction in which the pinned layer 53, the tunnel barrier layer 54 and the free layer 55 are stacked. The direction in which the pinned layer 53, the tunnel barrier layer 54 and the free layer 55 are stacked is parallel to the Z direction. The first and second electrodes 3 and 8 feed the TMR element 5 a sense current for detecting a signal corresponding to the signal magnetic field. The sense current flows in a direction intersecting the plane of the layers constituting the TMR element 5, such as a direction perpendicular to the plane of the layers constituting the TMR element 5.

The TMR element 5 varies in resistance in response to an external magnetic field, that is, a signal magnetic field from the recording medium. The resistance of the TMR element 5 can be determined from the sense current. In this way, the TMR element 5 is configured to detect a signal magnetic field from the recording medium. The read head unit uses the TMR element 5 to read data stored on the recording medium.

In the embodiment, the first and second electrodes 3 and 8 also serve as shields for the TMR element 5, and are each formed of a magnetic alloy. A pair of shields separate from the first and second electrodes 3 and 8 may also be provided on top and bottom of the TMR element 5.

The read head unit further includes the first and second bias magnetic field applying layers 6A and 6B. The first and second bias magnetic field applying layers 6A and 6B are located on opposite sides of the aforementioned at least part of the stack 50 in the track width direction TW. In the example shown in FIG. 1, the first and second bias magnetic field applying layers 6A and 6B are located on opposite sides of a part of the stack 50 in the track width direction TW, the part of the stack 50 extending from the cap layer 56 part-way through the antiferromagnetic layer 52.

At least part of the first insulating layer 4A is interposed between the first sidewall 50a and the first bias magnetic field applying layer 6A. At least part of the second insulating layer 4B is interposed between the second sidewall 50b and the second bias magnetic field applying layer 6B. Here, a portion of the antiferromagnetic layer 52 that is included in the aforementioned at least part of the stack 50 will be referred to as the first portion, and a portion of the antiferromagnetic layer 52 other than the first portion will be referred to as the second portion. The second portion has a first top surface portion and a second top surface portion located on opposite sides of the first portion in the track width direction TW. The first insulating layer 4A is interposed between the first sidewall 50a and the first bias magnetic field applying layer 6A, and between the first top surface portion and the first bias magnetic field applying layer 6A. The second insulating layer 4B is interposed between the second sidewall 50b and the second bias magnetic field applying layer 6B, and between the second top surface portion and the second bias magnetic field applying layer 6B.

The first and second bias magnetic field applying layers 6A and 6B apply a bias magnetic field to the TMR element 5. The bias magnetic field applied to the TMR element 5 by the first and second bias magnetic field applying layers 6A and 6B is for orienting the magnetization of the free layer 55 in a predetermined direction when no signal magnetic field is applied to the TMR element 5. In the read head unit of the first configuration example, each of the first and second bias magnetic field applying layers 6A and 6B may be formed of a hard magnetic layer (hard magnet), or may be composed of an antiferromagnetic layer of an antiferromagnetic material and a ferromagnetic layer stacked on each other.

The read head unit further includes the insulating refill layer 7. The insulating refill layer 7 is disposed around the stack 50, the first and second insulating layers 4A and 4B and the first and second bias magnetic field applying layers 6A and 6B. The insulating refill layer 7 is formed of magnesium oxide (MgO), for example.

Figure 5:
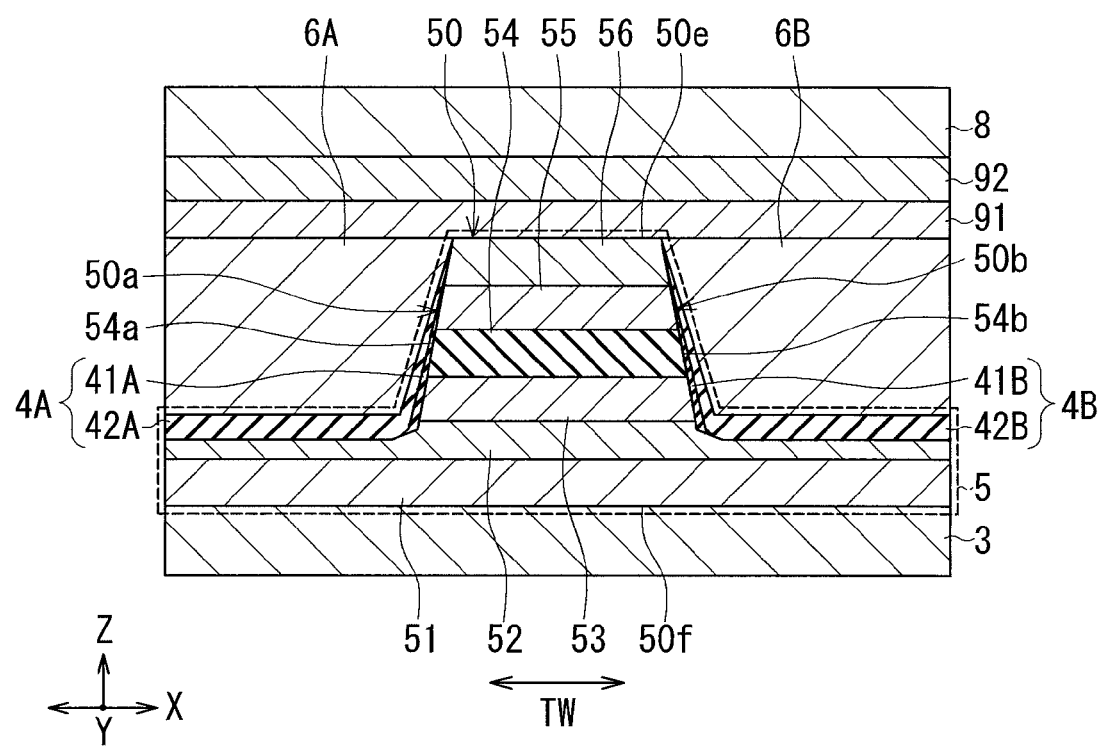
FIG. 5 is a cross-sectional view showing a cross section of a read head unit of a second configuration example parallel to the medium facing surface.

Now, a read head unit of a second configuration example will be described with reference to FIG. 5. The read head unit of the second configuration example is provided with an antiferromagnetic layer 91 and a metal layer 92 in addition to the components of the read head unit of the first configuration example. The antiferromagnetic layer 91 lies on the MR element 5, the bias magnetic field applying layers 6A and 6B and the insulating refill layer 7. The metal layer 92 lies on the antiferromagnetic layer 91. The antiferromagnetic layer 91 is formed of an antiferromagnetic material. The metal layer 92 is formed of a metal such as Ru.

In the read head unit of the second configuration example, the second electrode 8 lies on the metal layer 92. The parts from the first electrode 3 to the second electrode 8 constitute the read head unit of the second configuration example.

In the read head unit of the second configuration example, each of the first and second bias magnetic field applying layers 6A and 6B is formed of a soft magnetic layer. The magnetizations of the first and second bias magnetic field applying layers 6A and 6B are pinned by exchange coupling with the antiferromagnetic layer 91 at the respective interfaces with the antiferromagnetic layer 91.

The remainder of configuration of the read head unit of the second configuration example is the same as that of the read head unit of the first configuration example. Materials used for the layers constituting the TMR element 5 will now be described. The antiferromagnetic layer 52 is formed of an antiferromagnetic material such as IrMn. The pinned layer 53 is formed of, for example, a multilayer film composed of ferromagnetic layers of CoFe of different compositions. The free layer 55 is formed of a ferromagnetic material having a low coercivity such as NiFe or CoFe. The underlayer 51 and the cap layer 56 are each formed of Ta or Ru, or a layered film composed of Ta and Ru layers.

The tunnel barrier layer 54 contains a first oxide. The island-like structure sections 41A and 41B contain a second oxide. The coating sections 42A and 42B contain a third oxide. Each of the first to third oxides is a metal oxide or semiconductor oxide. Let G1 (kJ/mol), G2 (kJ/mol) and G3 (kJ/mol) represent standard Gibbs energies of formation at 280° C. of the first oxide, the second oxide and the third oxide, respectively. G1, G2, and G3 have the following relationships with each other. G2−G1 is greater than 0 (kJ/mol) and smaller than or equal to 435 (kJ/mol). G2−G3 is greater than 0 (kJ/mol) and smaller than or equal to 435 (kJ/mol). G3−G1 is smaller than or equal to 435 (kJ/mol). The meanings of such relationships will be described in detail later.

Now, the first to third oxides will be described specifically. Table 1 lists the standard Gibbs energies of formation at 280° C., denoted as G, of major oxides usable as the first to third oxides.

TABLE 1

| Oxides | G (kJ/mol) |
| --- | --- |
| MgO | −1135 |
| $Al_2O_3$ | −1025 |
| $SiO_2$ | −790 |
| $Ta_2O_5$ | −730 |
| MnO | −700 |

By way of example, a description will be given of a case where the first and third oxides are MgO and the second oxide is MnO. In this case, from Table 1, the standard Gibbs energy of formation at 280° C. of the first oxide (MgO) and that of the third oxide (MgO), i.e., G1 and G3, are both −1135 kJ/mol. Further, from Table 1, the standard Gibbs energy of formation at 280° C. of the second oxide (MnO), G2, is −700 kJ/mol. Both G2−G1 and G2−G3 are 435 kJ/mol. G3−G1 is 0 kJ/mol. Thus, such a combination of the first to third oxides satisfies the above-described requirements for the relationships between 01, G2 and G3.

Examples of the second and third oxides in the case where the first oxide is MgO will be described. In such a case, any one of $Al_2O_3$, $SiO_2$, $Ta_2O_5$, and MnO can be used as the second oxide. If the second oxide is $Al_2O_3$, then MgO can be used as the third oxide. If the second oxide is $SiO_2$, then MgO or $Al_2O_3$ can be used as the third oxide. If the second oxide is $Ta_2O_5$, then any of MgO, $Al_2O_3$ and $SiO_2$ can be used as the third oxide. If the second oxide is MnO, then any of MgO, $Al_2O_3$, $SiO_2$ and $Ta_2O_5$ can be used as the third oxide.

Possible combinations of the oxides to be used as the first to third oxides are not limited to the foregoing examples. Any combination may be used as long as the foregoing requirements for the relationships between G1, G2 and G3 are satisfied. For example, $Al_2O_3$ or $SiO_2$ may be used as the first oxide instead of MgO. In such a case also, the oxides to be used as the second and third oxides can be selected on the basis of the foregoing requirements for the relationships between G1, G2 and G3.

A manufacturing method for the magnetic head according to the embodiment will be outlined below. The manufacturing method for the magnetic head according to the embodiment fabricates a substructure by forming components of a plurality of magnetic heads, except the substrates, on a single wafer that includes portions to become the substrates of the plurality of magnetic heads. The substructure includes pre-slider portions arranged in rows, the pre-slider portions becoming individual sliders 210 later. Next, the substructure is cut into a slider assemblage that includes a row of pre-slider portions. The slider assemblage is then subjected to polishing on a surface thereof resulting from cutting the substructure, whereby the medium facing surface 40 is formed for each pre-slider portion included in the slider assemblage. Then, the slider assemblage is cut to separate the plurality of pre-slider portions from each other. This produces a plurality of sliders 210 including respective magnetic heads.

Now, with attention focused on a single magnetic head, the manufacturing method for the magnetic head will be described briefly. The manufacturing method for the magnetic head starts with forming the insulating layer 2 on the substrate 1. The read head unit of the embodiment is then formed on the insulating layer 2. Then, the insulating layer 71, the middle shield layer 72 and the nonmagnetic layer 73 are formed in this order on the read head unit. The write head unit of the embodiment is then formed on the nonmagnetic layer 73. Then, the overcoat layer 35 is formed to cover the write head unit. Wiring, terminals, and other components are then formed on the top surface of the overcoat layer 35. When the substructure is completed thus, the substructure is cut and the surface to become the medium facing surface 40 is polished into the medium facing surface 40 as described above. The slider 210 including the magnetic head is thereby completed.

A manufacturing method for the read head unit of the embodiment will now be described. First, reference is made to FIG. 10A to FIG. 17B to describe a first example of the manufacturing method for the read head unit. FIG. 10A to FIG. 17B each illustrate an intermediate structure formed in the process of manufacturing the read head unit. FIGS. 10A, 11A, 12A, 13A, 14A, 15A and 17A each show a cross section of the intermediate structure parallel to the location at which the medium facing surface 40 is to be formed. FIGS. 10B, 11B, 12B, 15C, 16B and 17B are plan views of the intermediate structure. FIGS. 13B, 14B, 15B and 16A each show a cross section of the intermediate structure perpendicular to the medium facing surface 40 and to the top surface of the substrate 1. The symbol "ABS" shown in some of these figures indicates the location at which the medium facing surface 40 is to be formed.

Figure 10A:
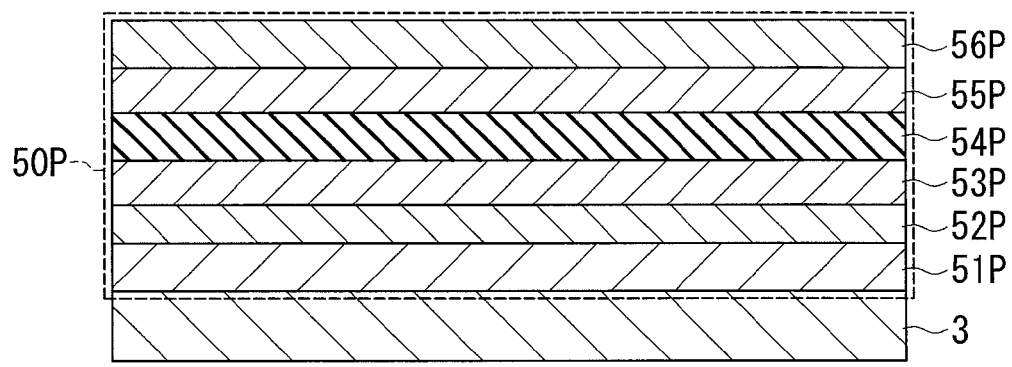
FIG. 10A and FIG. 10B are explanatory diagrams showing a step of a first example of a manufacturing method for a read head unit including a magnetoresistance element according to the embodiment of the invention.
Figure 10A:
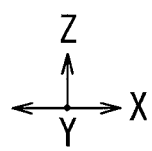
Figure 10B:
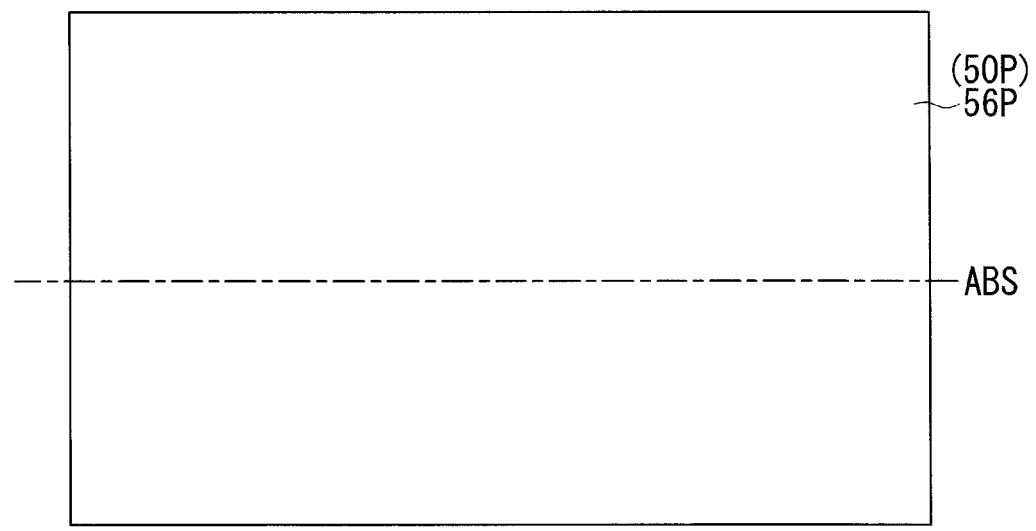
Figure 10B:
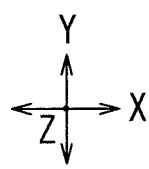

According to the first example of the manufacturing method for the read head unit, the first electrode 3 is first formed into a predetermined pattern on the insulating layer 2 by plating, for example. Then, a layered film 50P, which will later become the stack 50 of the TMR element 5, is formed on the first electrode 3. The layered film 50P includes six stacked layers 51P, 52P, 53P, 54P, 55P and 56P, which will later become the underlayer 51, the antiferromagnetic layer 52, the pinned layer 53, the tunnel barrier layer 54, the free layer 55 and the cap layer 56, respectively. The layers 51P to 56P are formed in this order on the first electrode 3. FIG. 10A and FIG. 10B show the intermediate structure after the formation of the layered film 50P.

Figure 11A:
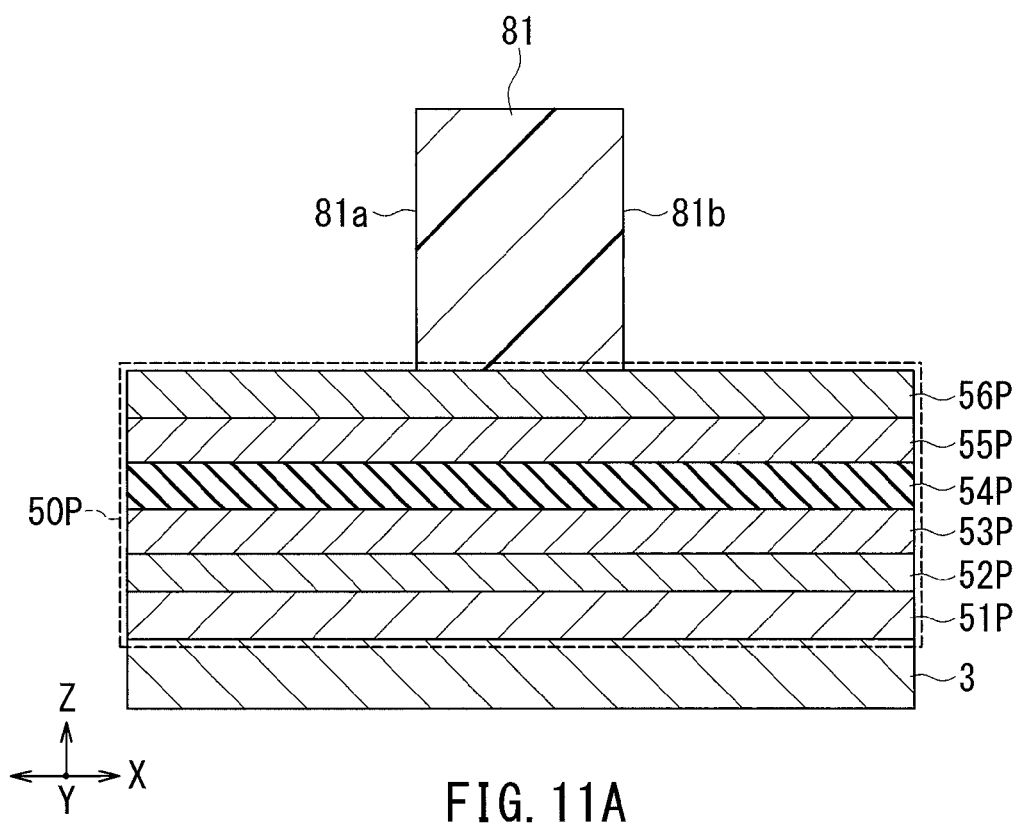
FIG. 11A and FIG. 11B are explanatory diagrams showing a step that follows the step shown in FIG. 10A and FIG. 10B.
Figure 11B:
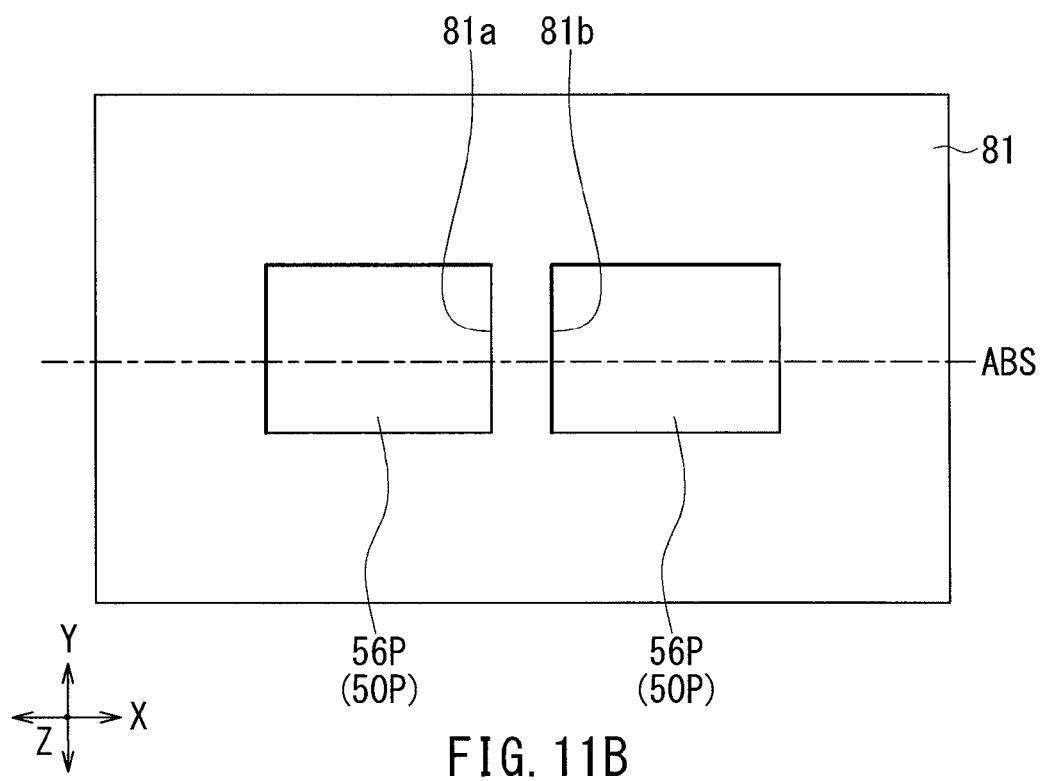

FIG. 11A and FIG. 11B show the next step. In this step, a mask 81 is formed on the layered film 50P. The mask 81 is formed by patterning a photoresist layer. The mask 81 has two openings 81a and 81b. The opening 81a is shaped to correspond to the planar shape (the shape as viewed from above) of the first bias magnetic field applying layer 6A to be formed later. The opening 81b is shaped to correspond to the planar shape of the second bias magnetic field applying layer 6B to be formed later.

Figure 12A:
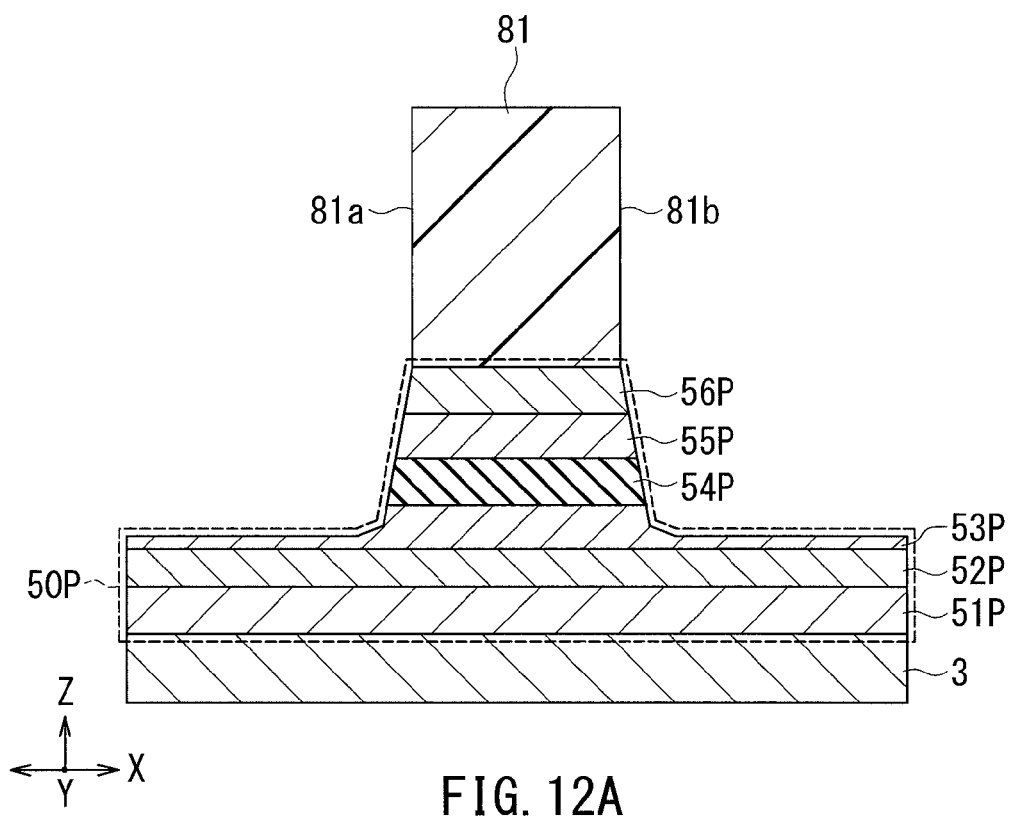
FIG. 12A and FIG. 12B are explanatory diagrams showing a step that follows the step shown in FIG. 11A and FIG. 11B.
Figure 12B:
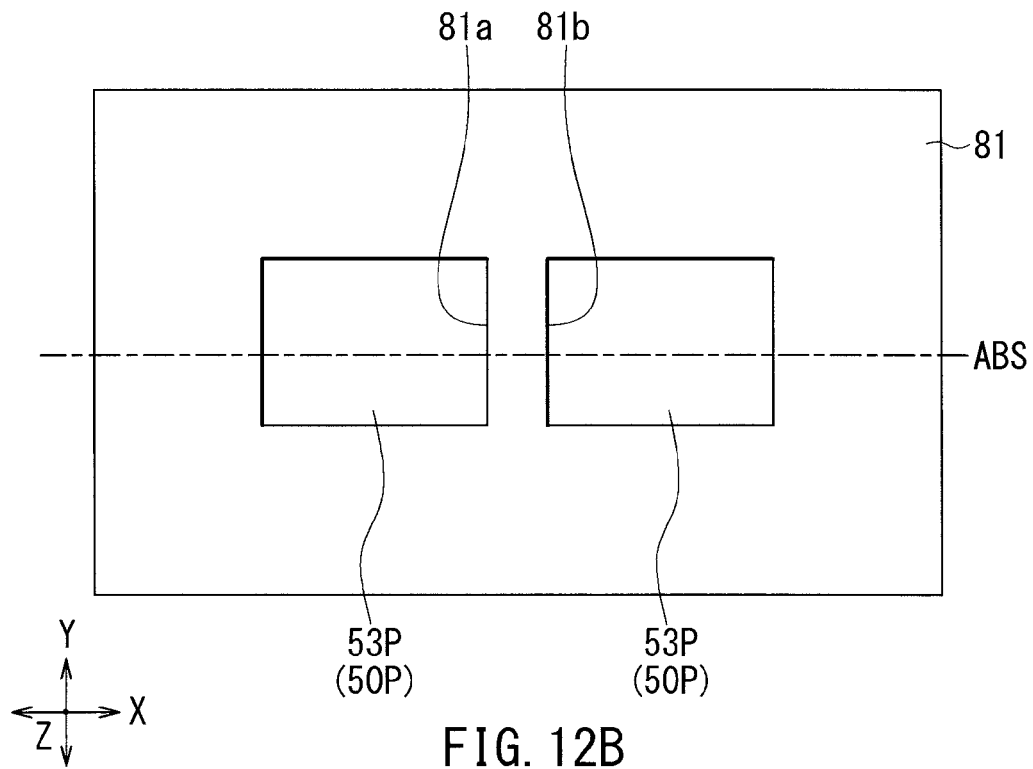

FIG. 12A and FIG. 12B show the next step. In this step, part of the layered film 50P is etched by, for example, ion milling, using the mask 81. In the case of employing ion milling to etch the layered film 50P, the ion beam is made to travel in a direction at an angle of 0° to 10° with respect to the direction perpendicular to the top surface of the substrate 1 (see FIG. 3 and FIG. 4). This etching is stopped when the bottom of the groove formed in the layered film 50P by the etching reaches a predetermined level within the range from the top surface to the bottom surface of any of the layers 51P to 53P. In the example shown in FIG. 12A and FIG. 12B, the etching is stopped when the bottom of the aforementioned groove reaches a level between the top surface and the bottom surface of the layer 53P before the etching. During this etching, flying substances generated by the etching of the layered film 50P adhere to the wall face of the aforementioned groove to form an adhesion film (not illustrated) on the wall face of the aforementioned groove.

Figure 13A:
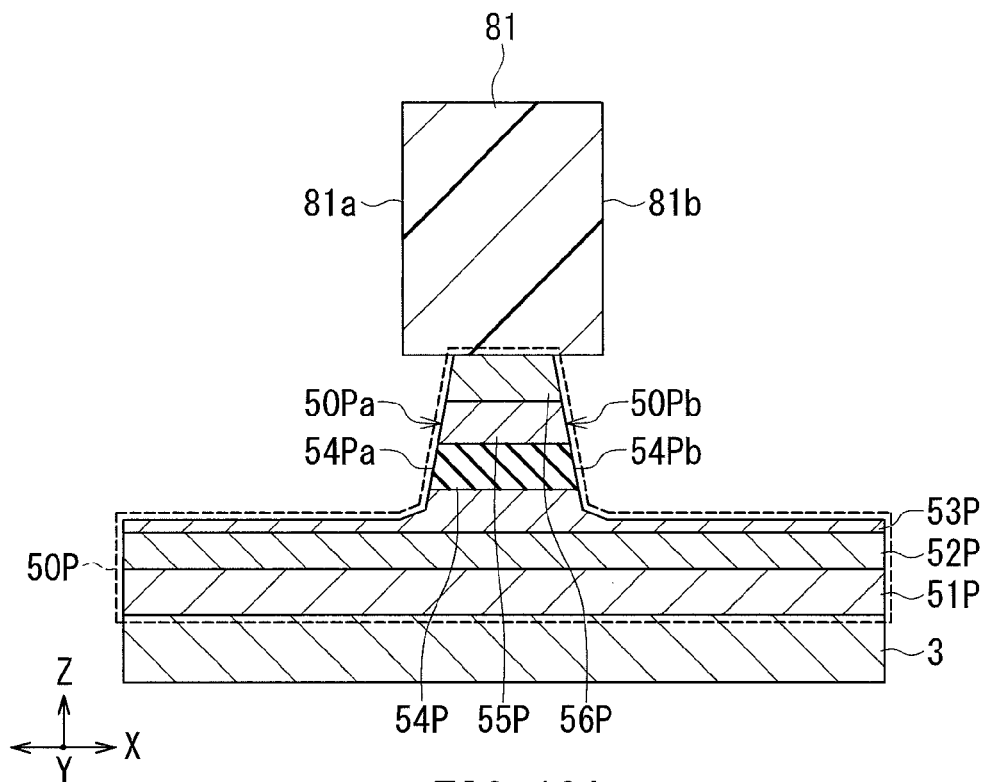
FIG. 13A and FIG. 13B are explanatory diagrams showing a step that follows the step shown in FIG. 12A and FIG. 12B.
Figure 13B:
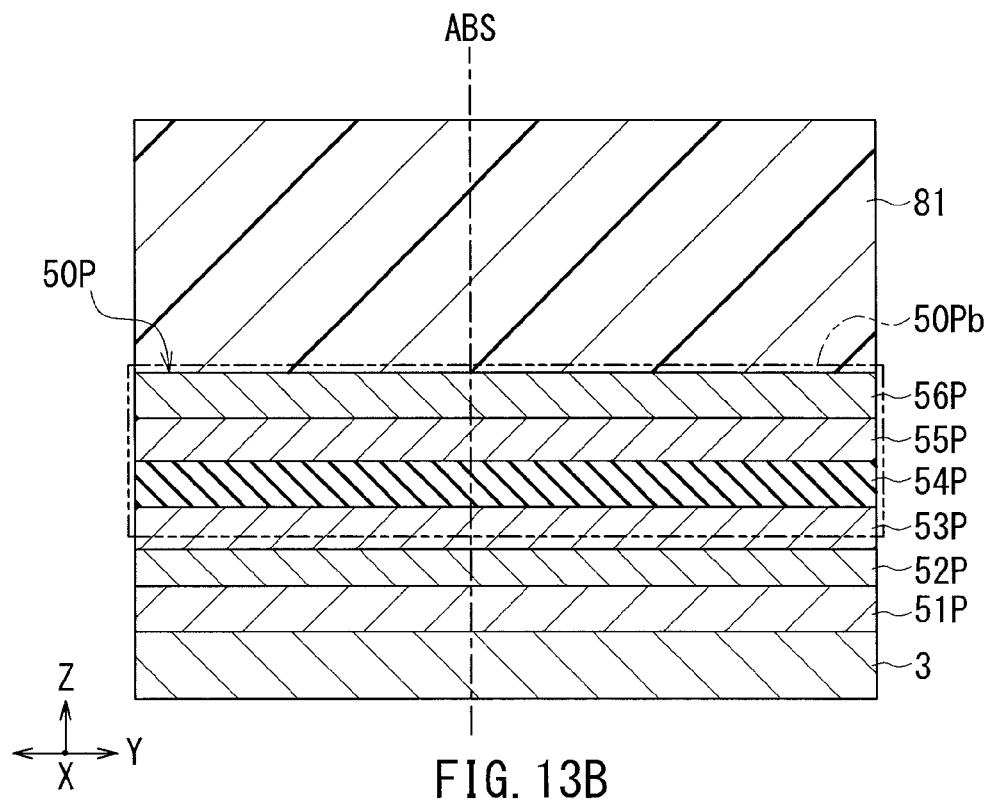

FIG. 13A and FIG. 13B show the next step. In this step, part of the layered film 50P is etched by, for example, ion milling, so that the adhesion film formed in the step shown in FIG. 12A and FIG. 12B is removed and the layered film 50P becomes smaller in width in the track width direction (the X direction). In the case of employing ion milling to etch the layered film 50P, the ion beam is made to travel in a direction at an angle of 50° to 70° with respect to the direction perpendicular to the top surface of the substrate 1 (see FIG. 3 and FIG. 4). This etching provides the layered film 50P with an initial first sidewall 50Pa including the first sidewall 50a, and an initial second sidewall 50Pb including the second sidewall 50b. This etching also provides the layer 54P with an initial first end face 54Pa including the first end face 54a, and an initial second end face 54Pb including the second end face 54b. In FIG. 13B, the region labeled 50Pb indicates the region where the initial second sidewall 50Pb is formed.

Figure 14A:
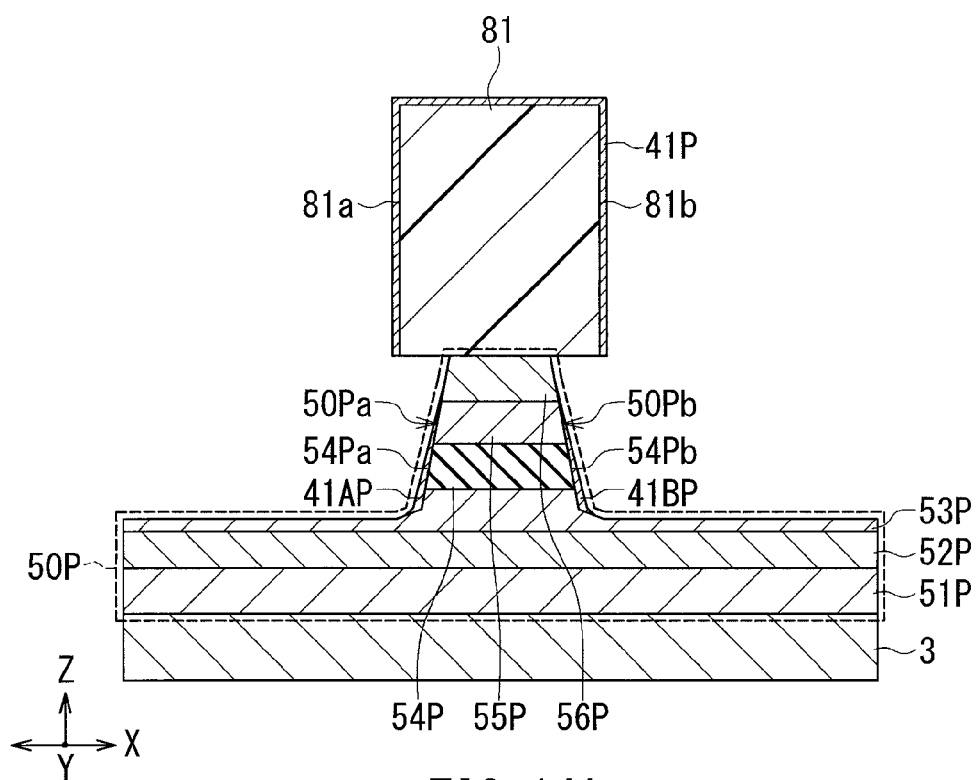
FIG. 14A and FIG. 14B are explanatory diagrams showing a step that follows the step shown in FIG. 13A and FIG. 13B.
Figure 14B:
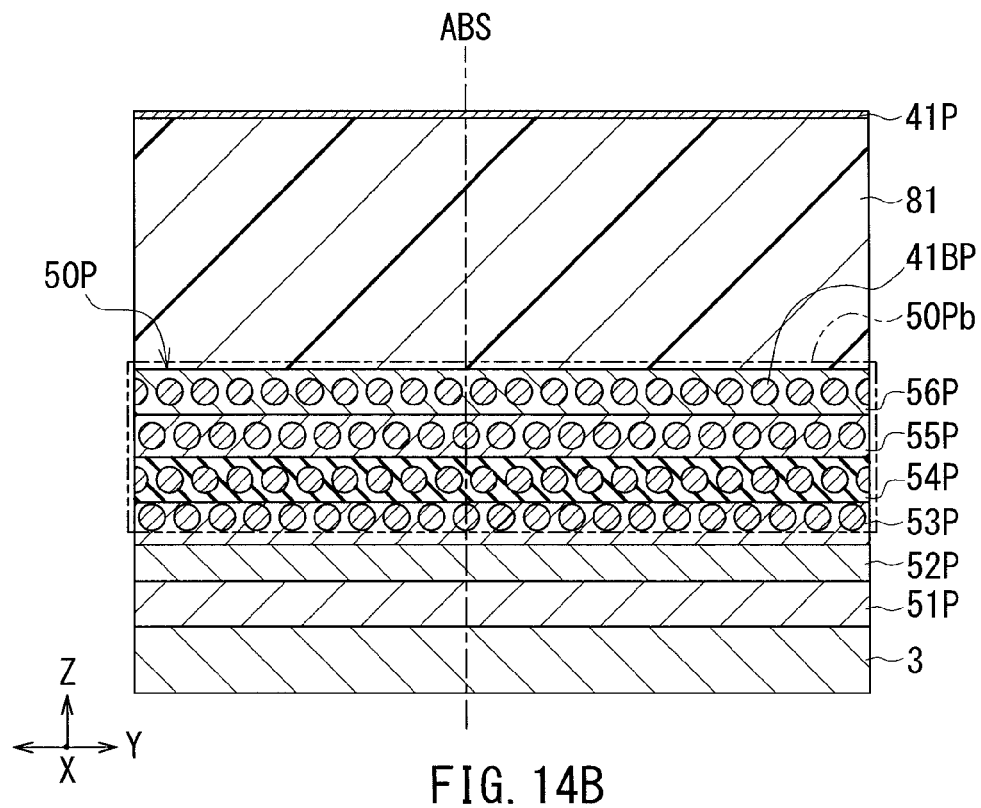

FIG. 14A and FIG. 14B show the next step. In this step, first, a first film and a second film are formed on the initial first sidewall 50Pa and the initial second sidewall 50Pb, respectively, by sputtering or vacuum deposition, for example. Each of the first and second films is a continuous film, and is formed of a metal element or semiconductor element constituting the second oxide described previously. The first and second films are about 2 nm in average thickness, for example. Next, the first and second films are etched to become thinner by ion milling, for example. Appropriately adjusting the etching amount of the first and second films in this etching makes the first and second films become unable to maintain the state of a continuous film. The first and second films are thereby made into first and second initial island-like structure sections 41AP and 41BP each having an island-like structure. The etching amount of the first and second films is as much as a thickness on the order of 1 nm of the first and second films, for example. In FIG. 14A and FIG. 14B the symbol 41P indicates a film formed on the surface of the mask 81 when forming the first and second films.

Figure 15A:
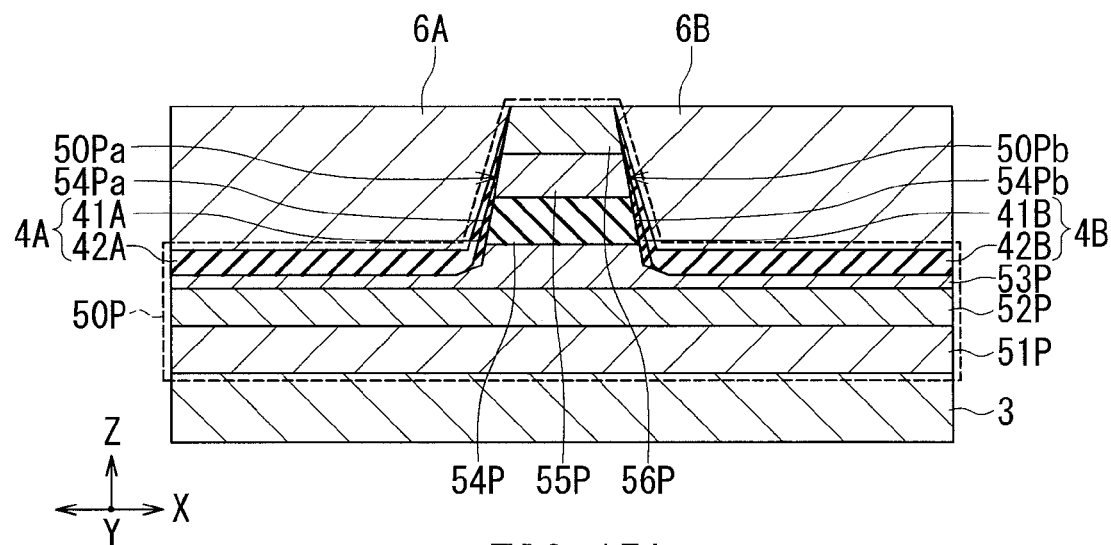
FIG. 15A to FIG. 15C are explanatory diagrams showing a step that follows the step shown in FIG. 14A and FIG. 14B.
Figure 15B:
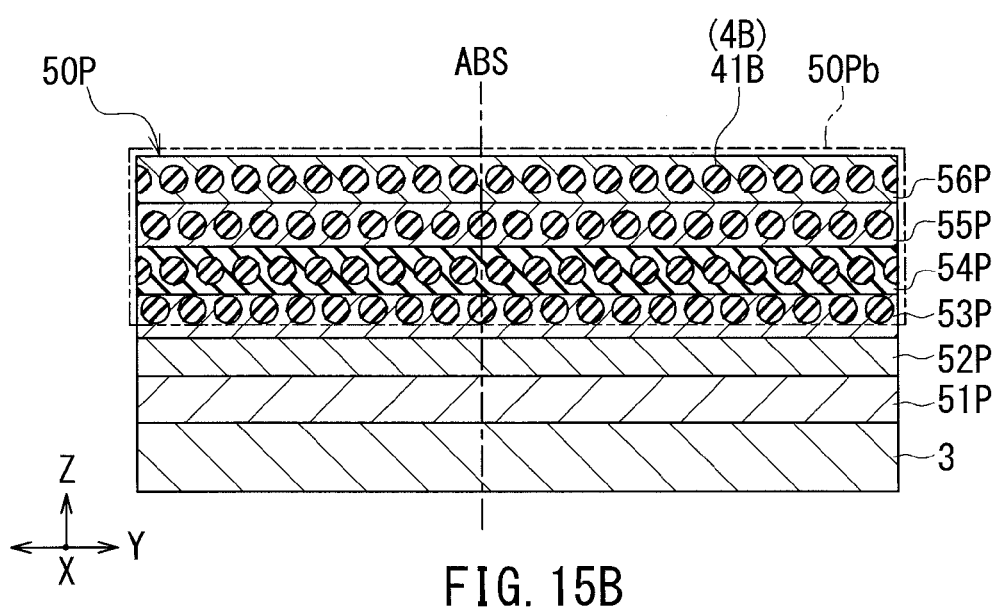
Figure 15C:
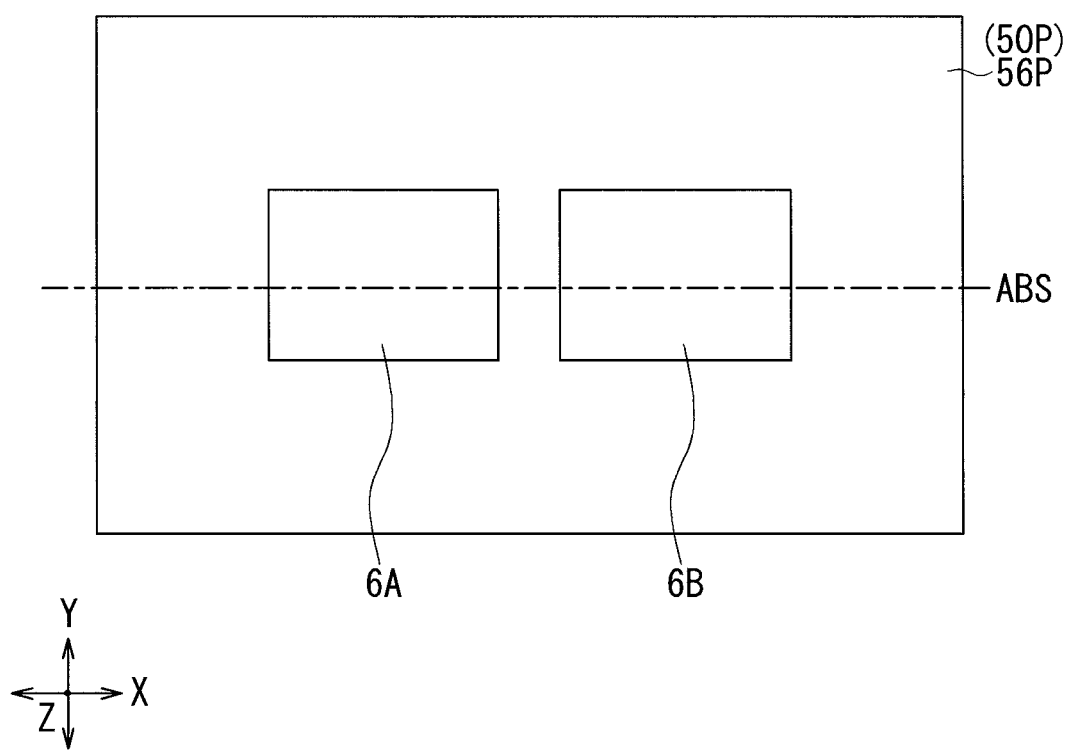

FIG. 15A and FIG. 15B show the next step. In this step, first, the first and second initial island-like structure sections 41AP and 41BP are oxidized. This makes the first and second initial island-like structure sections 41AP and 41BP into the first and second island-like structure sections 41A and 41B, respectively. Next, the coating section 42A is formed to cover the island-like structure section 41A and the initial first sidewall 50Pa, and the coating section 42B is formed to cover the island-like structure section 41B and the initial second sidewall 50Pb, by sputtering, for example. The first and second insulating layers 4A and 4B are thereby completed. Then, the first and second bias magnetic field applying layers 6A and 6B are formed on the first and second insulating layers 4A and 4B, respectively, by sputtering, for example. The mask 81 is then removed.

Figure 16A:
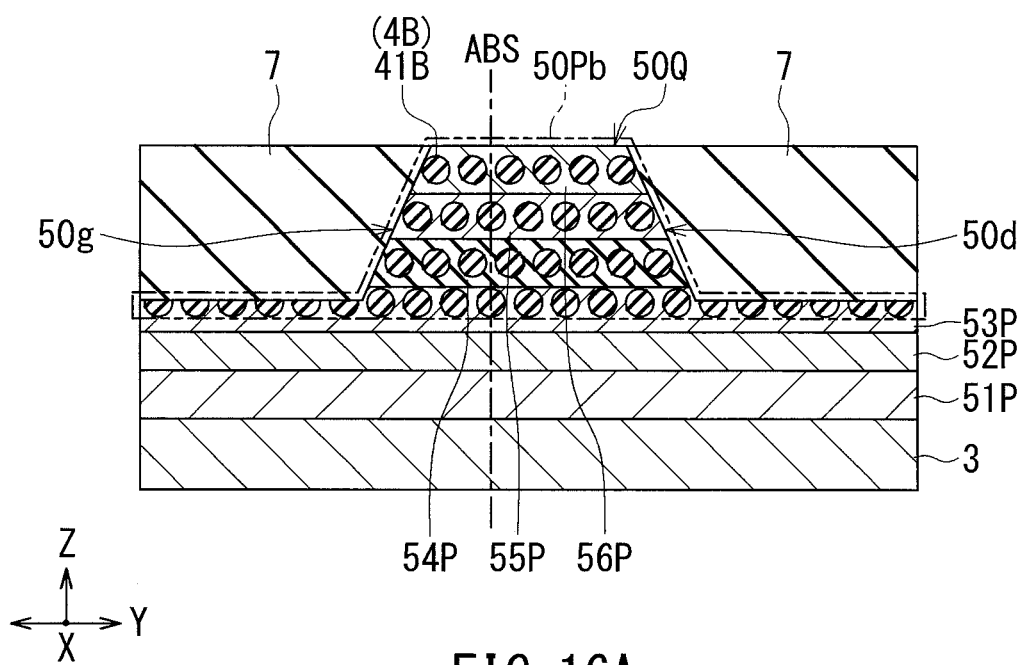
FIG. 16A and FIG. 16B are explanatory diagrams showing a step that follows the step shown in FIG. 15A to FIG. 15C.
Figure 16B:
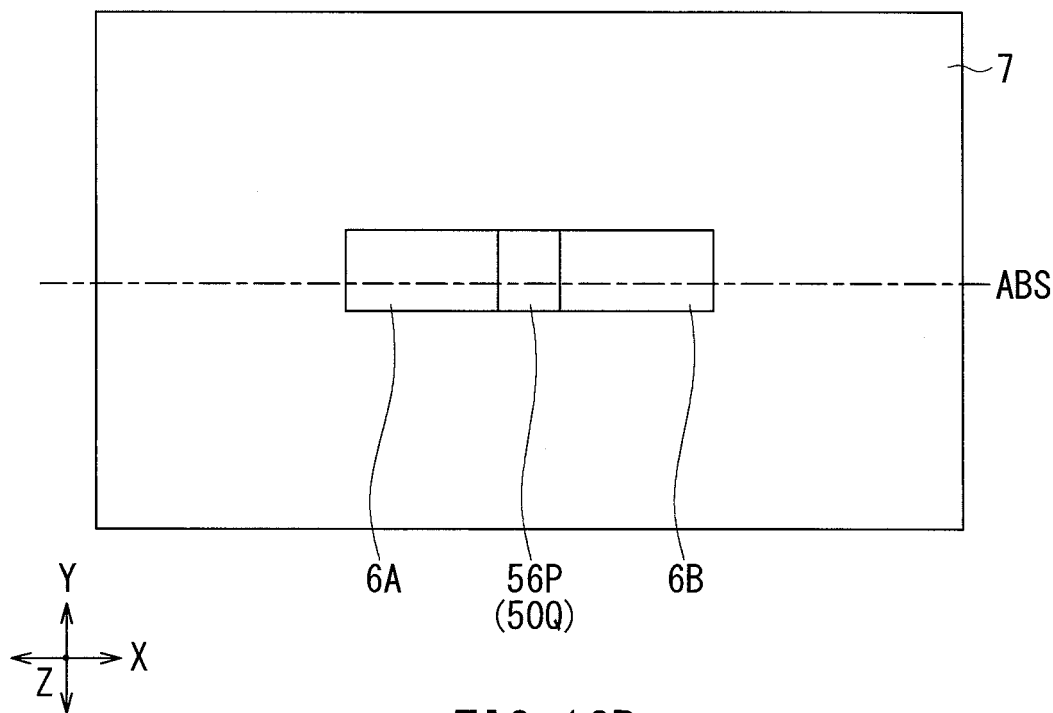

FIG. 16A and FIG. 16B show the next step. In this step, first, a mask (not illustrated) is formed on the layered film 50P, the first bias magnetic field applying layer 6A and the second bias magnetic field applying layer 6B. The mask is formed by patterning a photoresist layer. Then, part of the layered film 50P is etched by using the mask to thereby provide the layered film 50P with the rear end face 50d of the stack 50. This etching is stopped when the bottom of the groove formed in the layered film 50P by the etching reaches a level between the top surface and the bottom surface of the layer 53P before the etching. The etching makes the layered film 50P into an initial stack 50Q. In the example shown in FIG. 16A, the initial stack 50Q has a surface 50g in addition to the rear end face 50d. The surface 50g is located in a region that is to be removed later in the step of forming the medium facing surface 40. During this etching, flying substances generated by the etching of the layered film 50P may adhere to the rear end face 50d and the surface 50g to form adhesion films (not illustrated). In such a case, part of the initial stack 50Q may be etched to remove the adhesion films by ion milling, for example. Next, the insulating refill layer 7 is formed on the initial stack 50Q by sputtering, for example. The mask is then removed.

Figure 17A:
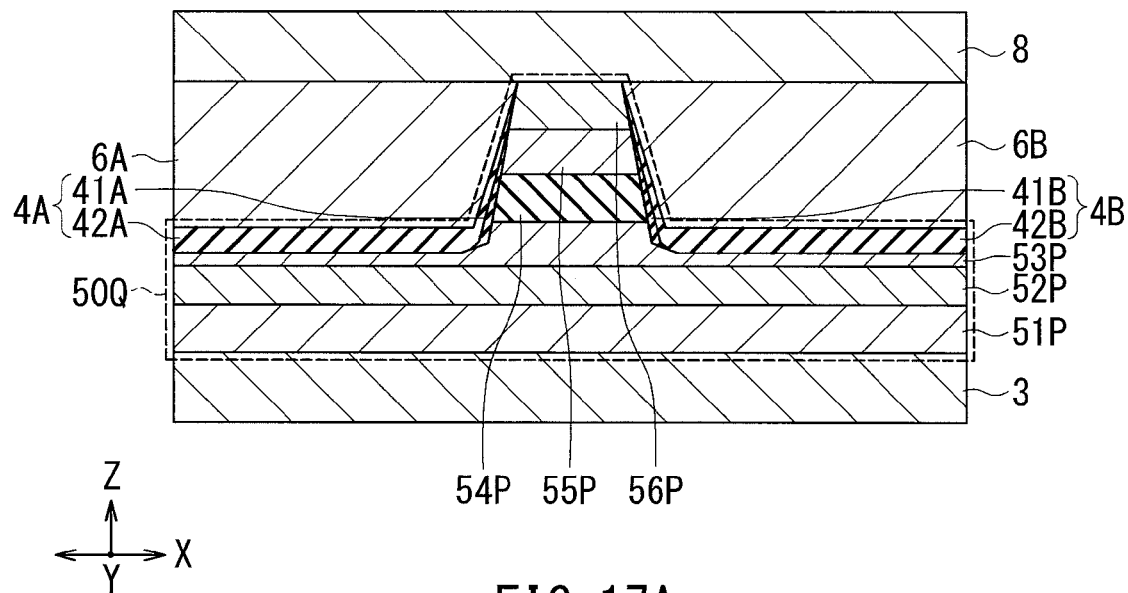
FIG. 17A and FIG. 17B are explanatory diagrams showing a step that follows the step shown in FIG. 16A and FIG. 16B.
Figure 17B:
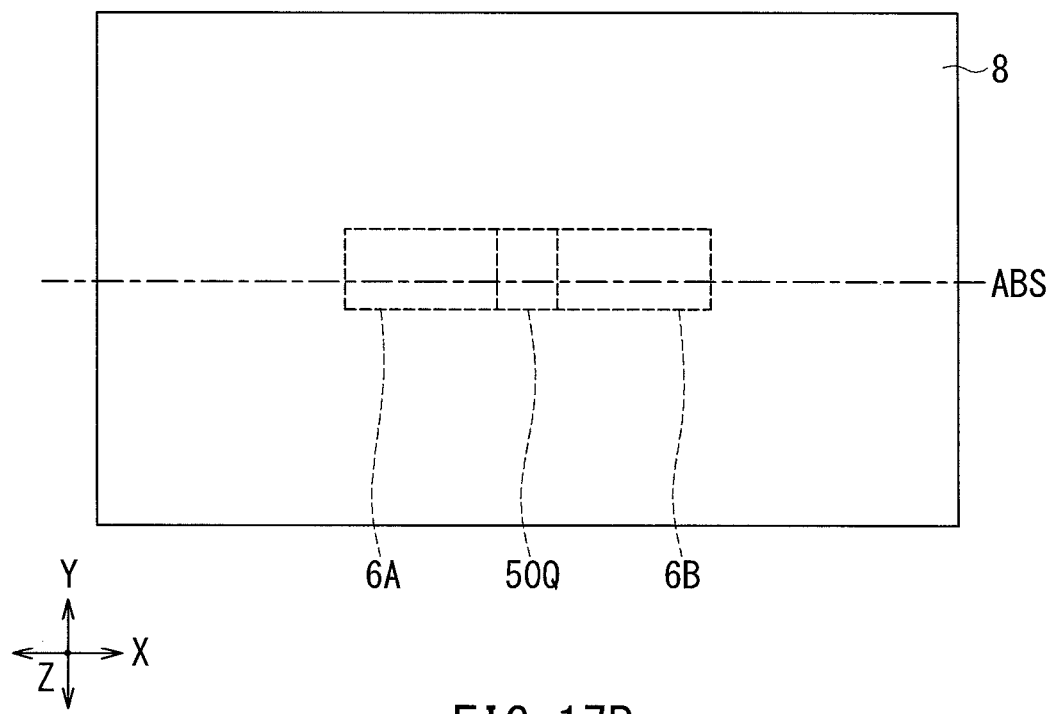

FIG. 17A and FIG. 17B show the next step. The step shown in FIG. 17A and FIG. 17B is for the case where the read head unit is of the first configuration example. In this case, the second electrode 8 is formed in this step on the initial stack 50Q, the first and second bias magnetic field applying layers 6A and 6B and the insulating refill layer 7. For the case where the read head unit is of the second configuration example, the antiferromagnetic layer 91, the metal layer 92 and the second electrode 8 are formed in this order on the initial stack 50Q, the first and second bias magnetic field applying layers 6A and 6B and the insulating refill layer 7.

According to the manufacturing method for the magnetic head, the aforementioned substructure is fabricated by forming the remaining components of the magnetic head on the intermediate structure resulting from the step shown in FIG. 17A and FIG. 17B. Then, the step of forming the medium facing surface 40 is performed to provide the initial stack 50Q with the front end face 50c, thereby making the initial stack 50Q into the stack 50. The layers 51P to 56P become the underlayer 51, the antiferromagnetic layer 52, the pinned layer 53, the tunnel barrier layer 54, the free layer 55 and the cap layer 56, respectively. The initial first sidewall 50Pa, the initial second sidewall 50Pb, the initial first end face 54Pa and the initial second end face 54Pb become the first sidewall 50a, the second sidewall 50b, the first end face 54a and the second end face 54b, respectively.

Figure 18:
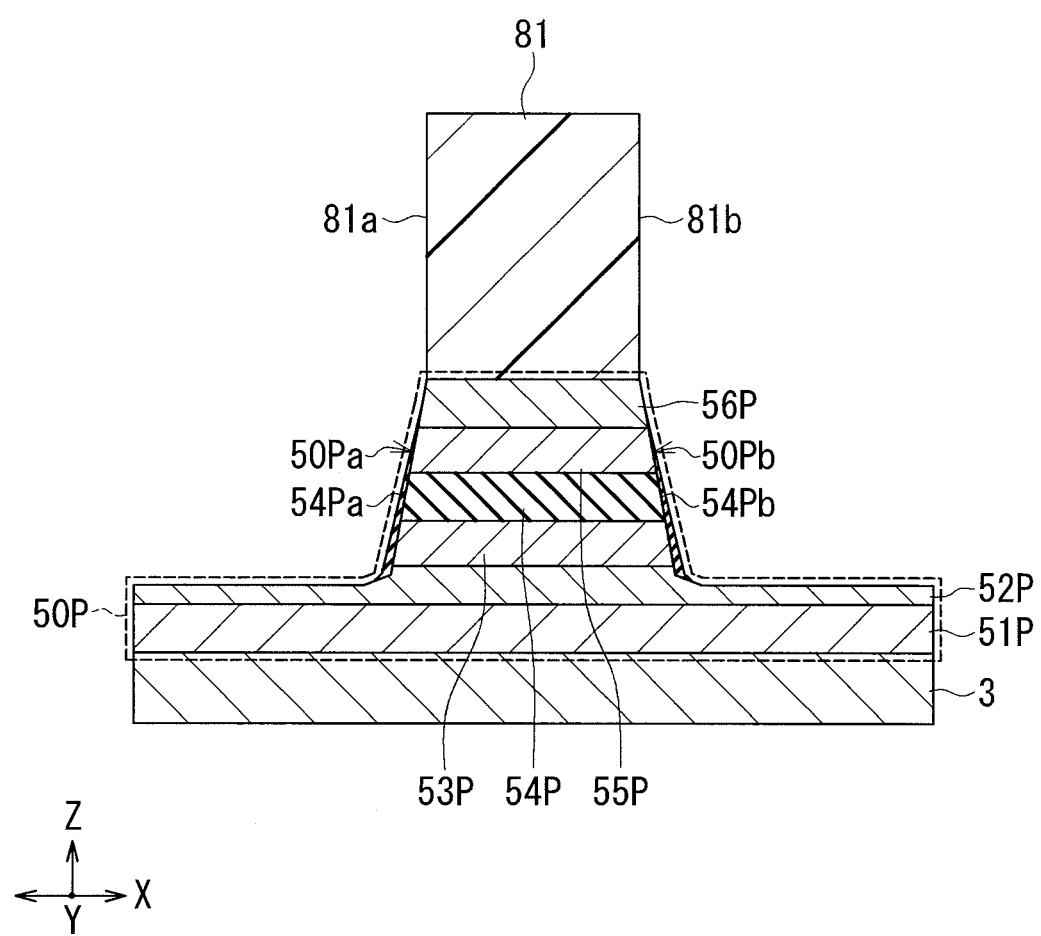
FIG. 18 is a cross-sectional view showing a step of a second example of the manufacturing method for the read head unit including the magnetoresistance element according to the embodiment of the invention.

A second example of the manufacturing method for the read head unit will now be described with reference to FIG. 18. FIG. 18 illustrates an intermediate structure formed in the process of manufacturing the read head unit. FIG. 18 shows a cross section of the intermediate structure parallel to the location at which the medium facing surface 40 is to be formed.

The second example of the manufacturing method is the same as the first example of the manufacturing method up to the step shown in FIG. 11A and FIG. 11B. For the second example, however, the layer 52P to become the antiferromagnetic layer 52 is formed of an antiferromagnetic material containing a metal element or semiconductor element constituting the second oxide mentioned previously. Such an antiferromagnetic material may be IrMn, for example. FIG. 18 shows the next step. In this step, part of the layered film 50P is etched by, for example, ion milling, using the mask 81. For the second example, in particular, the etching is stopped when the bottom of the groove formed in the layered film 50P by the etching reaches a level between the top surface and the bottom surface of the layer 52P before the etching. For the second example, this etching provides the layered film 50P with an initial first sidewall 50Pa including the first sidewall 50a and an initial second sidewall 50Pb including the second sidewall 50b. This etching also provides the layer 54P with an initial first end face 54Pa including the first end face 54a, and an initial second end face 54Pb including the second end face 54b.

During this etching, flying substances generated by the etching of the layered film 50P adhere to the initial first sidewall 50Pa and the initial second sidewall 50Pb to form an adhesion film on each of the initial first sidewall 50Pa and the initial second sidewall 50Pb. The adhesion film contains, as its principal component, an element constituting the layer etched just before stopping the etching. In the second example, the adhesion film contains, as its principal component, an element constituting the layer 52P, that is, a metal element or a semiconductor element constituting the second oxide.

In the second example, the adhesion film is an aggregate of a plurality of mutually isolated components, thus being a film of island-like structure. The reason is as follows. In an initial stage of formation of a thin film that is formed by depositing atoms or molecules, like the adhesion film, a plurality of islands are typically formed. As the amount of deposition of the atoms or molecules increases, the plurality of islands grow and coalesce into a continuous film. However, in the case of the adhesion film, the amount of deposition of the atoms or molecules is not so large as to form a continuous film. For example, the amount of deposition of the atoms or molecules of the adhesion film is equivalent to a thickness of 1 to 2 nm. The adhesion film is thus less likely to be a continuous film. During the etching of the layered film 50P, each of the initial first sidewall 50Pa and the initial second sidewall 50Pb undergoes the formation of the adhesion film and the etching of the adhesion film simultaneously. This also makes the adhesion film less likely to be a continuous film. In addition, the surfaces of the initial first sidewall 50Pa and the initial second sidewall 50Pb formed by the etching are not smooth. This also makes the adhesion film less likely to be a continuous film. Consequently, the adhesion film is formed as a film of island-like structure.

The adhesion film described above is to become the island-like structure sections 41A and 41B later. This adhesion film will hereinafter be referred to as initial island-like structure section.

In the step shown in FIG. 18, the initial island-like structure section is then oxidized to form an oxide film containing the second oxide. A portion of this oxide film formed on the initial first sidewall 50Pa becomes the island-like structure section 41A, and another portion formed on the initial second sidewall 50Pb becomes the island-like structure section 41B. The subsequent steps are the same as those in the first example of the manufacturing method.

Figure 19:
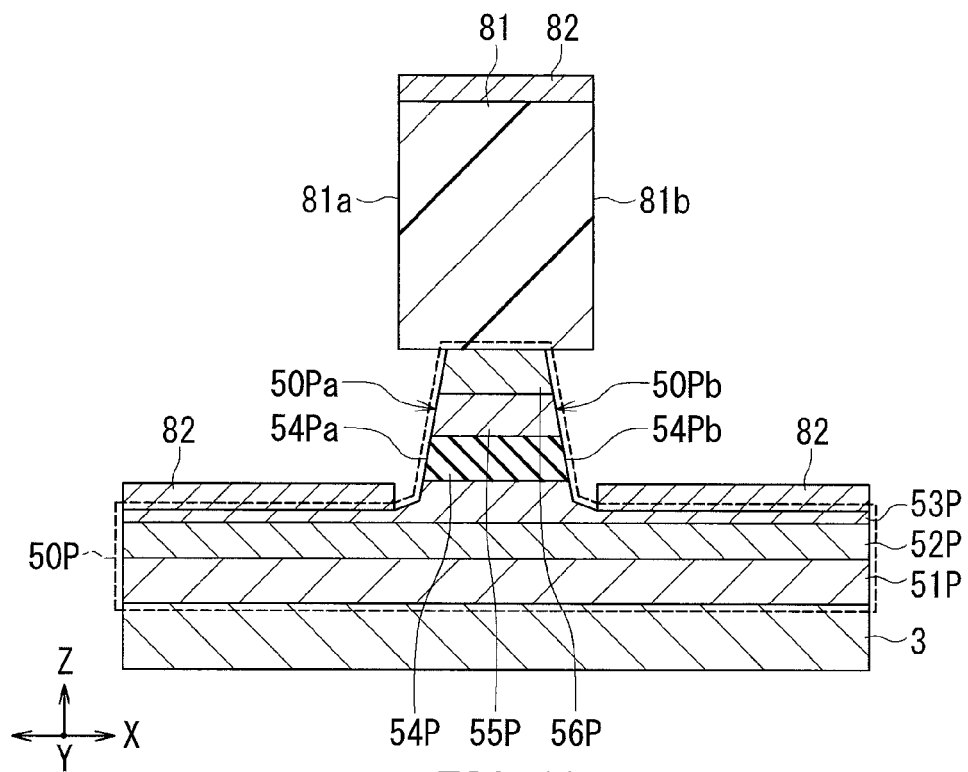
FIG. 19 is a cross-sectional view showing a step of a third example of the manufacturing method for the read head unit including the magnetoresistance element according to the embodiment of the invention.
Figure 20:
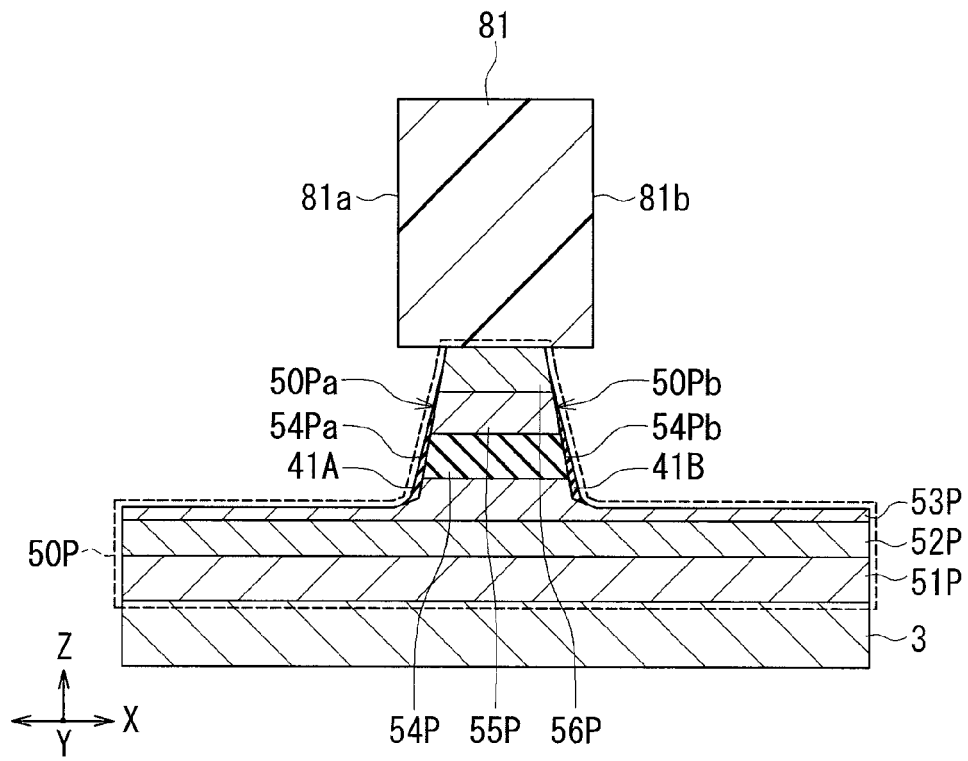
FIG. 20 is a cross-sectional view showing a step that follows the step shown in FIG. 19.

A third example of the manufacturing method for the read head unit will now be described with reference to FIG. 19 and FIG. 20. FIG. 19 and FIG. 20 illustrate an intermediate structure formed in the process of manufacturing the read head unit. FIG. 19 and FIG. 20 show a cross section of the intermediate structure parallel to the location at which the medium facing surface 40 is to be formed.

The third example of the manufacturing method is the same as the first example of the manufacturing method up to the step shown in FIG. 13A and FIG. 13B. FIG. 19 shows the next step. In this step, a film 82 is formed on the layered film 50P. The film 82 is formed of an metal element or semiconductor element constituting the second oxide. The film 82 is formed on the top surface of the layer 53P, and on neither of the initial first and second sidewalls 50Pa and 50Pb. This can be achieved by a deposition method by which the material for forming the film 82 travels in the direction perpendicular to the top surface of the substrate 1 (see FIG. 3 and FIG. 4). The film 82 is formed also on the top surface of the mask 81.

FIG. 20 shows the next step. In this step, the film 82 on the top surface of the layer 53P is etched by ion milling, for example. During this etching, flying substances generated by the etching of the film 82 adhere to the initial first sidewall 50Pa and the initial second sidewall 50Pb to form an adhesion film on each of the initial first sidewall 50Pa and the initial second sidewall 50Pb. The adhesion film contains an element constituting the film 82, that is, a metal element or semiconductor element constituting the second oxide. The adhesion film is formed as an island-like film like the adhesion film generated in the second example of the manufacturing method. The adhesion film is to become the island-like structure sections 41A and 41B later. The adhesion film will hereinafter be referred to as initial island-like structure section.

In the step shown in FIG. 20, the initial island-like structure section is then oxidized to form an oxide film containing the second oxide. A portion of this oxide film formed on the initial first sidewall 50Pa becomes the island-like structure section 41A, and another portion formed on the initial second sidewall 50Pb becomes the island-like structure section 41B. The subsequent steps are the same as those in the first example of the manufacturing method.

Now, functions and effects unique to the TMR element 5 according to the embodiment will be described. The embodiment makes it possible to prevent a reduction in the magnetoresistance change ratio (hereinafter referred to as MR ratio) of the TMR element 5 resulting from heat treatment. This will be described in detail below. Here, the resistance of the TMR element 5 when the magnetization direction of the free layer 55 forms a zero angle with respect to the magnetization direction of the pinned layer 53 will be referred to as the minimum resistance value of the TMR element 5. The MR ratio of the TMR element 5 is the ratio of a maximum magnetoresistance change of the TMR element 5 to the minimum resistance value of the TMR element 5.

The TMR element 5 has the following features (A) and (B).

[Feature A]

The at least one insulating layer in contact with the at least one sidewall of the stack 50 includes the island-like structure section and the coating section. In the embodiment, the at least one insulating layer is the first insulating layer 4A and the second insulating layer 4B. The first insulating layer 4A includes the island-like structure section 41A and the coating section 42A. The second insulating layer 4B includes the island-like structure section 41B and the coating section 42B. Hereinafter, reference numeral 4 will be used to represent whichever one of the first and second insulating layers, reference numeral 41 will be used to represent whichever one of the island-like structure sections, and reference numeral 42 will be used to represent whichever one of the coating sections.

[Feature B]

G1, G2 and G3, i.e., the standard Gibbs energies of formation at 280° C. of the first, second and third oxides, have the relationships defined by Equations (1), (2) and (3) below. Equations (1), (2), and (3) are mathematical expressions of the foregoing requirements for the relationships between G1, G2 and G3.

$$0 \text{ (kJ/mol)} < G2 - G1 \leq 435 \text{ (kJ/mol)} \tag{1}$$

$$0 \text{ (kJ/mol)} < G2 - G3 \leq 435 \text{ (kJ/mol)} \tag{2}$$

$$G3 - G1 \leq 435 \text{ (kJ/mol)} \tag{3}$$

The effect of the feature B will be described first. The higher the standard Gibbs energy of formation a metal or semiconductor oxide has, the more likely the oxide is to undergo a reduction reaction. In other words, the higher the standard Gibbs energy of formation a metal or semiconductor oxide has, the more likely the oxide is to lose oxygen and change into the metal or semiconductor. Consequently, the greater G2−G1 is, the more likely oxygen is to move from the island-like structure section 41 to the tunnel barrier layer 54 during heat treatment. Similarly, the greater G2−G3 is, the more likely oxygen is to move from the island-like structure section 41 to the coating section 42 during heat treatment. If oxygen moves from the island-like structure section 41 to the tunnel barrier layer 54 or the coating section 42, at least part of the island-like structure section 41 changes into a metal or semiconductor. As a result, the free layer 55 and the pinned layer 53 can be short-circuited to reduce the MR ratio.

The greater G3−G1 is, the more likely oxygen is to move from the coating section 42 to the tunnel barrier layer 54 during heat treatment. If oxygen moves from the coating section 42 to the tunnel barrier layer 54, at least part of the coating section 42 changes into a metal or semiconductor. As a result, the free layer 55 and the pinned layer 53 can be short-circuited to reduce the MR ratio.

Experiments showed that a reduction in the MR ratio due to heat treatment was prevented when G1, G2 and G3 had the relationships defined by Equations (1), (2) and (3).

Equation (1) defines a condition that can sufficiently suppress the movement of oxygen from the island-like structure section 41 to the tunnel barrier layer 54 during heat treatment. Equation (2) defines a condition that can sufficiently suppress the movement of oxygen from the island-like structure section 41 to the coating section 42 during heat treatment. Among various oxides, MgO is one having a relatively low standard Gibbs energy of formation at 280° C. Accordingly, if both of the first and third oxides are MgO, both of G2−G1 and G2−G3 are likely to be greater than 0 (kJ/mol). As a result, the problem of a reduction in the MR ratio due to the movement of oxygen from the island-like structure section 41 to the tunnel barrier layer 54 or to the coating section 42 can occur easily. The embodiment is intended to prevent the occurrence of the problem in such a case. Therefore, in the embodiment, both G2−G1 and G2−G3 are defined to be greater than 0 (kJ/mol).

Equation (3) defines a condition that can sufficiently suppress the movement of oxygen from the coating section 42 to the tunnel barrier layer 54 during heat treatment. The first oxide and the third oxide may be the same. Thus, G3−G1 may be 0 (kJ/mol). When the first oxide and the third oxide are different from each other, G3-G1 may be smaller than or equal to 0 (kJ/mol).

Oxides typically usable as the third oxide include MgO, $Al_2O_3$ and $SiO_2$. If the first oxide is MgO and the third oxide is any one of MgO, $Al_2O_3$ and $SiO_2$, G3−G1 falls within the range of 0 (kJ/mol) to 435 (kJ/mol). In view of this, the following Equation (4) may be defined instead of Equation (3) as one of the requirements to be met by the embodiment.

$$0 \text{ (kJ/mol)} \leq G3-G1 \leq 435 \text{ (kJ/mol)} \quad (4)$$

By virtue of the above-described feature B, the TMR element 5 according to the embodiment makes it possible to prevent a reduction in the MR ratio resulting from heat treatment.

Next, the effect of the feature A will be described. The island-like structure section 41 is an aggregate of a plurality of mutually isolated components. Thus, even if a reduction reaction occurs in the island-like structure section 41, the free layer 55 and the pinned layer 53 are not necessarily short-circuited via the island-like structure section 41. The TMR element 5 according to the embodiment having not only the feature B but also the feature A can effectively prevent a reduction in the MR ratio resulting from heat treatment.

The effects of the embodiment will be discussed in a stochastic manner below. Initially, we will consider a TMR element of a first comparative example in which the insulating layer 4 is formed as a continuous film of a single oxide. Let G4 (kJ/mol) represent the standard Gibbs energy of formation at 280° C. of the oxide constituting the continuous film. Suppose that the TMR element of the first comparative example suffers a short circuit between the free layer 55 and the pinned layer 53 with a probability of "1" if G4−G1 makes a value D that is greater than 435 (kJ/mol).

Next, suppose that the TMR element of the first comparative example suffers a short circuit between the free layer 55 and the pinned layer 53 with a probability of P1 if G4−G1 is greater than 0 (kJ/mol) and smaller than or equal to 435 (kJ/mol). If G4−G1 is greater than 0 (kJ/mol) and smaller than or equal to 435 (kJ/mol), the oxide constituting the continuous film is less likely to undergo a reduction reaction. P1 thus has a value sufficiently smaller than 1. Such an effect derives from the feature B alone.

Suppose that the TMR element 5 according to the embodiment suffers a short circuit between the free layer 55 and the pinned layer 53 with a probability of P2 if G2−G1 is D. The island-like structure section 41 is constituted by a plurality of mutually isolated components. Thus, even if a reduction reaction occurs in the island-like structure section 41, the free layer 55 and the pinned layer 53 are not necessarily short-circuited via the island-like structure portion 41. P2 is thus smaller than 1. Such an effect derives from the feature A alone.

The probability that a short circuit between the free layer 55 and the pinned layer 53 occurs in the TMR element 5 according to the embodiment is considered to be P1×P2. Since P1 and P2 are both smaller than 1, P1×P2 is smaller than both of P1 and P2. For example, if P1 and P2 are both 0.1, P1×P2 is 0.01.

As can be seen from the foregoing discussion, the present embodiment can prevent a reduction in the MR ratio resulting from heat treatment by virtue of the synergistic effect of the features A and B.

Next, a description will be given of the results of an experiment that confirmed the prevention of a reduction in the MR ratio resulting from heat treatment. In the experiment, a plurality of TMR elements 5 of Example and a plurality of TMR elements of a second comparative example were fabricated and measured for a minimum resistance value and MR ratio.

First, the TMR element 5 of Example will be described. The TMR element 5 of Example corresponds to the TMR element 5 according to the embodiment. The TMR element 5 of Example has the same configuration as that of the TMR element 5 shown in FIG. 1 and FIG. 2. In the TMR element 5 of Example, the antiferromagnetic layer 52 is formed of an antiferromagnetic material consisting of IrMn. The pinned layer 53 is formed of a multilayer film of ferromagnetic layers of CoFe of different compositions.

The tunnel barrier layer 54 contains MgO as the first oxide. The island-like structure sections 41A and 41B contain MnO as the second oxide. The coating sections 42A and 42B contain MgO as the third oxide. The TMR element 5 of Example is one fabricated by the second example of the manufacturing method for the read head unit including the TMR element 5 according to the embodiment.

Figure 21:
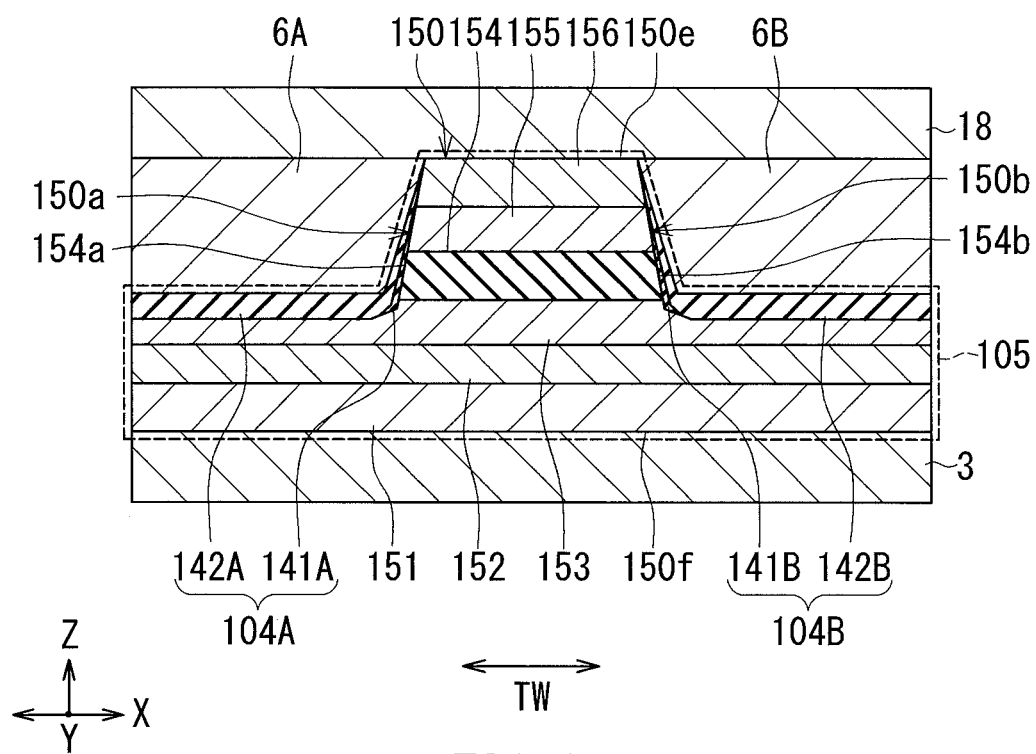
FIG. 21 is a cross-sectional view showing a cross section of a read head unit including a magnetoresistance element of a second comparative example, the cross section being parallel to the medium facing surface.

Next, the TMR element of the second comparative example will be described with reference to FIG. 21. FIG. 21 is a cross-sectional view showing a cross section of a read head unit including the TMR element 105 of the second comparative example, the cross section being parallel to the medium facing surface 40. The TMR element 105 of the second comparative example includes a stack 150. The stack 150 has basically the same configuration as that of the stack 50 of the embodiment. The stack 150 has a first sidewall 150a and a second sidewall 150b located at opposite ends of a part of the stack 150 in the track width direction TW, and further has a top surface 150e, a bottom surface 150f, and a front end face and a rear end face (not illustrated). The stack 150 includes an underlayer 151, an antiferromagnetic layer 152, a pinned layer 153, a tunnel barrier layer 154, a free layer 155, and a cap layer 156. The locations and materials of the underlayer 151, the antiferromagnetic layer 152, the pinned layer 153, the tunnel barrier layer 154, the free layer 155 and the cap layer 156 are the same as those of the underlayer 51, the antiferromagnetic layer 52, the pinned layer 53, the tunnel barrier layer 54, the free layer 55 and the cap layer 56 of the TMR element 5 of Example, respectively.

In the TMR element 105 of the second comparative example, the first and second sidewalls 150a and 150b are shaped differently from the first and second sidewalls 50a and 50b of the TMR element 5 of Example. The first and second sidewalls 150a and 150b are formed to extend from the top surface 150e to the pinned layer 153.

The TMR element 105 of the second comparative example further includes a first insulating layer 104A and a second insulating layer 104B. The first insulating layer 104A includes an island-like structure section 141A and a coating section 142A. The second insulating layer 104B includes an island-like structure section 141B and a coating section 142B. The first and second insulating layers 104A and 104B, the island-like structure sections 141A and 141B, and the coating sections 142A and 142B are shaped and located in the same manner as the first and second insulating layers 4A and 4B, the island-like structure sections 41A and 41B, and the coating sections 42A and 42B of the TMR element 5 of Example. The coating sections 142A and 142B are formed of the same material as the coating sections 42A and 42B of the TMR element of Example.

In the TMR element 105 of the second comparative example, the island-like structure sections 141A and 141B are formed of a different material from that used for the island-like structure sections 41A and 41B of the TMR element 5 of Example. The island-like structure sections 141A and 141B contain iron oxide and cobalt oxide.

Like the TMR element 5 of Example, the TMR element 105 of the second comparative example is one fabricated by the second example of the manufacturing method for the read head unit including the TMR element 5 according to the embodiment. However, the TMR element 105 of the second comparative example differs in the level at which the etching is stopped in the step of forming the initial first sidewall including the first sidewall 150a and the initial second sidewall including the second sidewall 150b in the layered film to be the stack 150 (see FIG. 18). In the TMR element 105 of the second comparative example, the etching is stopped when the bottom of the groove formed in the layered film by the etching reaches the level between the top surface and bottom surface, before the etching, of the layer to be the pinned layer 53. The layer to be the pinned layer 53 is formed of a multilayer film composed of ferromagnetic layers of CoFe of different compositions. The adhesion film formed on each of the initial first and second sidewalls by the etching thus contains iron and cobalt. The adhesion film is then oxidized to form an oxide film containing iron oxide and cobalt oxide. A portion of the oxide film that is formed on the initial first sidewall becomes the island-like structure section 141A, and a portion of the oxide film that is formed on the initial second sidewall becomes the island-like structure section 141B.

Next, details of the experiment will be described. In the experiment, the minimum resistance values and MR ratios of the plurality of TMR elements 5 of Example and the plurality of TMR elements 105 of the second comparative example were initially determined before heat treatment. Then, the plurality of TMR elements 5 of Example and the plurality of TMR elements 105 of the second comparative example were subjected to heat treatment having a temperature profile of 280° C. for 10 minutes, 260° C. for two hours, and 210° C. for two hours. Next, the minimum resistance values R and the MR ratios of the plurality of TMR elements 5 of Example and the plurality of TMR elements 105 of the second comparative example after the heat treatment were determined.

Figure 22:
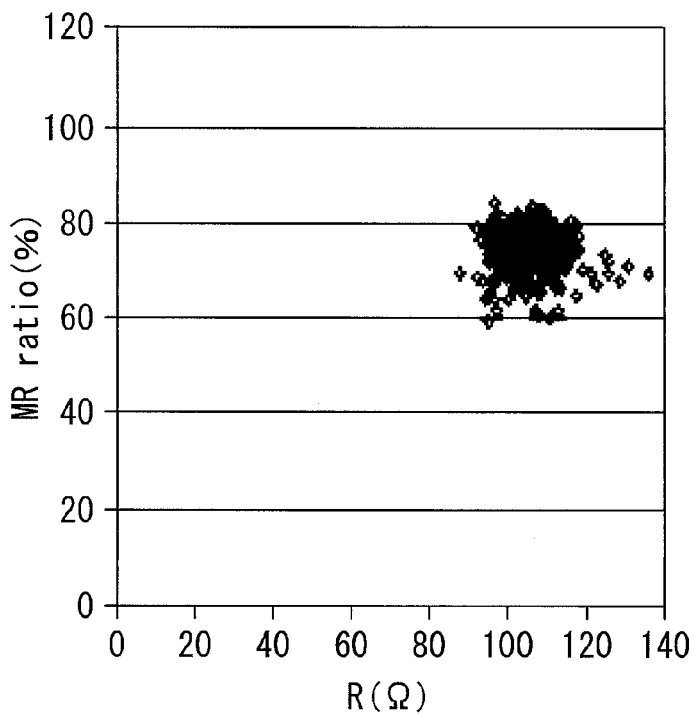
FIG. 22 is a characteristic diagram showing the minimum resistance values and magnetoresistance change ratios of a plurality of magnetoresistance elements of the second comparative example before heat treatment.
Figure 23:
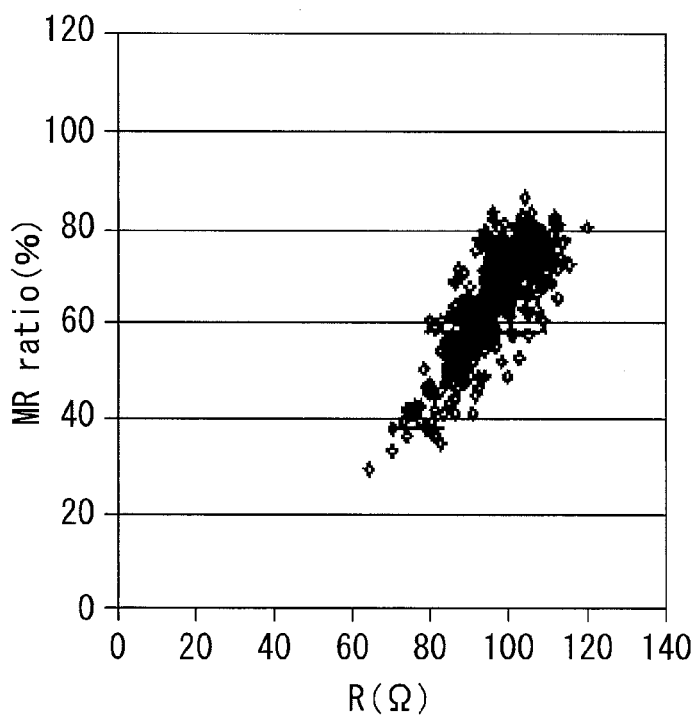
FIG. 23 is a characteristic diagram showing the minimum resistance values and magnetoresistance change ratios of the plurality of magnetoresistance elements of the second comparative example after heat treatment.
Figure 24:
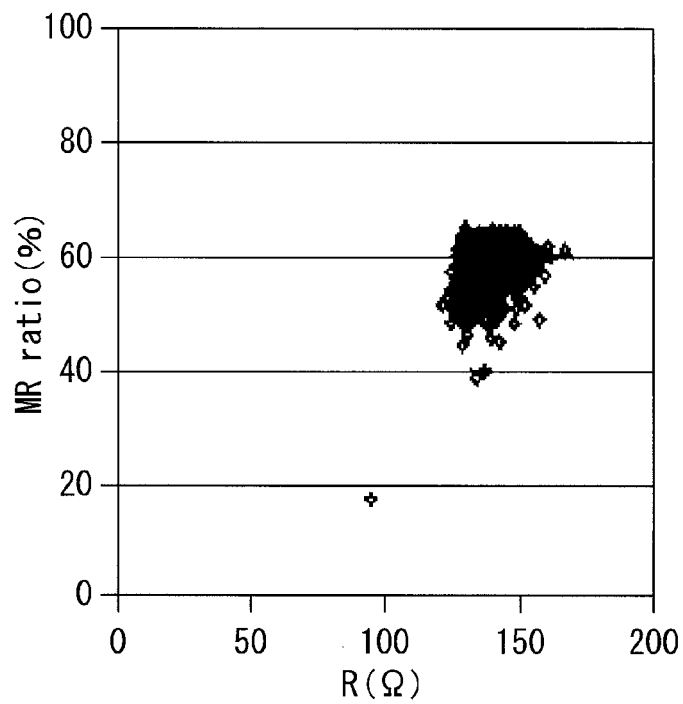
FIG. 24 is a characteristic diagram showing the minimum resistance values and magnetoresistance change ratios of a plurality of magnetoresistance elements of Example before heat treatment.
Figure 25:
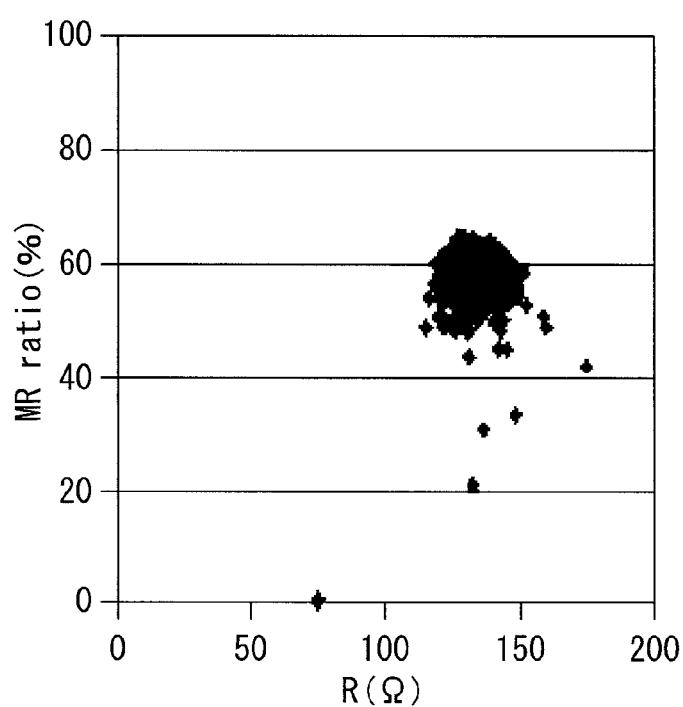
FIG. 25 is a characteristic diagram showing the minimum resistance values and magnetoresistance change ratios of the plurality of magnetoresistance elements of Example after heat treatment.

FIG. 22 to FIG. 25 show the results of the experiment. FIG. 22 shows the minimum resistance values R and the MR ratios of the plurality of TMR elements 105 of the second comparative example before the heat treatment. FIG. 23 shows the minimum resistance values R and the MR ratios of the plurality of TMR elements 105 of the second comparative example after the heat treatment. FIG. 24 shows the minimum resistance values R and the MR ratios of the plurality of TMR elements 5 of Example before the heat treatment. FIG. 25 shows the minimum resistance values R and the MR ratios of the plurality of TMR elements 5 of Example after the heat treatment. In FIG. 22 to FIG. 25, the horizontal axis indicates the minimum resistance value R, and the vertical axis the MR ratio.

It can be seen from FIG. 22 and FIG. 23 that, of the total number of the plurality of TMR elements 105 of the second comparative example, the proportion of the number of TMR elements 105 with the MR ratio reduced due to the heat treatment is too high to ignore. In contrast, FIG. 24 and FIG. 25 show that, of the total number of the plurality of TMR elements 5 of Example, the proportion of the number of TMR elements 5 with the MR ratio reduced due to the heat treatment is extremely low. From the experiment, it can be seen that the TMR element 5 according to the embodiment is able to prevent a reduction in the MR ratio resulting from heat treatment.

Figure 26:
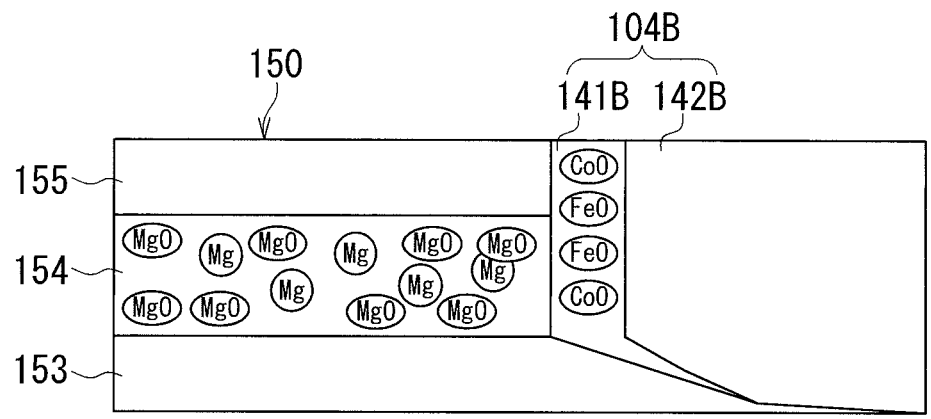
FIG. 26 is an explanatory diagram schematically illustrating the state of a tunnel barrier layer and an island-like structure section of the magnetoresistance element of the second comparative example before heat treatment.
Figure 27:
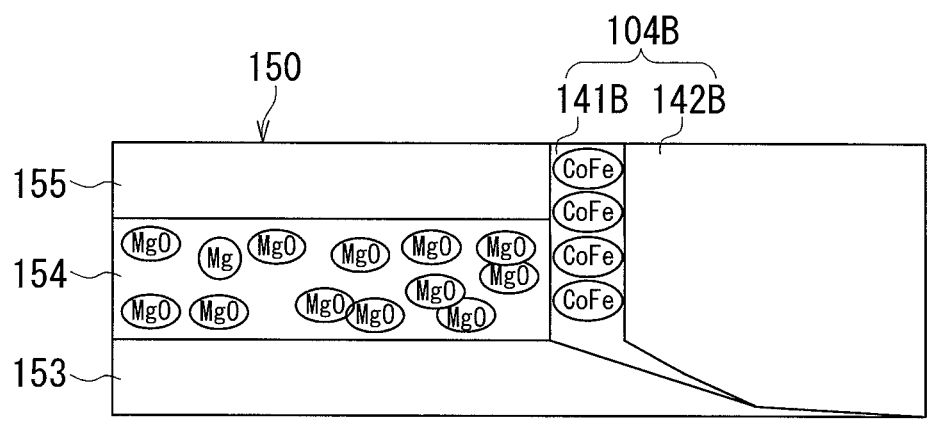
FIG. 27 is an explanatory diagram schematically illustrating the state of the tunnel barrier layer and the island-like structure section of the magnetoresistance element of the second comparative example after heat treatment.

Now, the reason for the reduction in the MR ratio of the TMR element 105 of the second comparative example will be described with reference to FIG. 26 and FIG. 27. FIG. 26 is an explanatory diagram schematically illustrating the state of the tunnel barrier layer 154 and the island-like structure section 141B of the TMR element 105 of the second comparative example before the heat treatment. FIG. 27 is an explanatory diagram schematically illustrating the state of the tunnel barrier layer 154 and the island-like structure section 141B of the TMR element 105 of the second comparative example after the heat treatment. For the sake of convenience, FIG. 26 and FIG. 27 show the island-like structure section 141B as a continuous film.

As shown in FIG. 26, the tunnel barrier layer 154 before the heat treatment is predominantly composed of MgO, and also contains Mg in a metallic state due to oxygen deficiency.

The island-like structure section 141B before the heat treatment contains iron oxide and cobalt oxide. In FIG. 26, iron oxide and cobalt oxide are represented by FeO and CoO, respectively. Although not shown, the island-like structure section 141A also contains iron oxide and cobalt oxide. Iron oxide and cobalt oxide are higher in standard Gibbs energy of formation at 280° C. than MnO which is used as the foregoing second oxide. Letting G2 (kJ/mol) be the standard Gibbs energy of formation at 280° C. of iron oxide or cobalt oxide, the foregoing Equation (1) or (2) does not hold. Iron oxide and cobalt oxide are thus more likely to lose oxygen and change into metal than any oxide used as the second oxide. If the foregoing heat treatment is performed on the TMR element 105 of the second comparative example, a reduction reaction occurs in the island-like structure sections 141A and 141B. Consequently, as shown in FIG. 27, the iron oxide and cobalt oxide in the island-like structure sections 141A and 141B change into, for example, CoFe. This can be considered to cause the free layer 155 and the pinned layer 153 to be short-circuited via the island-like structure sections 141A and 141B to reduce the MR ratio of the TMR element 105 of the second comparative example. Oxygen lost from the iron oxide and cobalt oxide moves, for example, to the tunnel barrier layer 154 and is combined with Mg contained in the tunnel barrier layer 154.

In contrast, in the TMR element 5 of Example, the occurrence of a reduction reaction as in the TMR element 105 of the second comparative example is prevented by the effect of the foregoing feature B. A reduction in the MR ratio of the TMR element 5 is thus suppressed.

The present invention is not limited to the foregoing embodiment, and various modifications may be made thereto. For example, the at least one sidewall of the stack 50 may be formed to extend from the top surface of the cap layer 56 to the bottom surface of the underlayer 51.

The thin-film magnetic head of the present invention may be intended for read operations only, incorporating no write head unit.

Further, the magnetoresistance element of the present invention may be for use in not only a read head unit of a thin-film magnetic head but also a magnetic memory, for example.

Obviously, many modifications and variations of the present invention are possible in the light of the above teachings. Thus, it is to be understood that, within the scope of the appended claims and equivalents thereof, the invention may be practiced in other than the foregoing most preferable embodiment.

What is claimed is:

1. A magnetoresistance element comprising:
a stack having at least one sidewall; and
at least one insulating layer in contact with the at least one sidewall, wherein
the stack includes a first ferromagnetic layer, a second ferromagnetic layer, and a tunnel barrier layer located between the first ferromagnetic layer and the second ferromagnetic layer,
the tunnel barrier layer has at least one end face located in the at least one sidewall of the stack,
the at least one insulating layer includes: an island-like structure section in contact with only a part of the at least one sidewall; and a coating section covering the island-like structure section and the at least one sidewall,
the tunnel barrier layer contains a first oxide,
the island-like structure section contains a second oxide,
the coating section contains a third oxide, and
G2−G1 is greater than 0 (kJ/mol)) and smaller than or equal to 435 (kJ/mol), G2−G3 is greater than 0 (kJ/mol) and smaller than or equal to 435 (kJ/mol), and G3−G1 is smaller than or equal to 435 (kJ/mol), where G1 (kJ/mol), G2 (kJ/mol) and G3 (kJ/mol) represent standard Gibbs energies of formation at 280° C. of the first oxide, the second oxide and the third oxide, respectively.

2. The magnetoresistance element according to claim 1, wherein the first ferromagnetic layer is a free layer whose magnetization direction changes in response to an external magnetic field, and the second ferromagnetic layer is a pinned layer whose magnetization direction is pinned.

3. A thin-film magnetic head comprising:
a medium facing surface to face a recording medium; and
the magnetoresistance element of claim 1,
wherein the magnetoresistance element is configured to detect a signal magnetic field from the recording medium.

4. The thin-film magnetic head according to claim 3, further comprising:
first and second electrodes for feeding the magnetoresistance element a current for detecting a signal corresponding to the signal magnetic field; and
first and second bias magnetic field applying layers for applying a bias magnetic field to the magnetoresistance element, wherein
the first and second electrodes are located on opposite sides of the stack in a direction in which the first ferromagnetic layer, the tunnel barrier layer and the second ferromagnetic layer are stacked,
the at least one sidewall of the stack is a first sidewall and a second sidewall located at opposite ends of at least part of the stack in a track width direction,
the at least one end face of the tunnel barrier layer is a first end face and a second end face located in the first sidewall and the second sidewall, respectively,
the at least one insulating layer is a first insulating layer and a second insulating layer in contact with the first sidewall and the second sidewall, respectively,
the first and second bias magnetic field applying layers are located on opposite sides of the at least part of the stack in the track width direction,
at least part of the first insulating layer is interposed between the first sidewall and the first bias magnetic field applying layer, and
at least part of the second insulating layer is interposed between the second sidewall and the second bias magnetic field applying layer.

5. A head assembly comprising:
a slider disposed to face a recording medium; and
a supporter flexibly supporting the slider, wherein
the slider includes a thin-film magnetic head,
the thin-film magnetic head includes: a medium facing surface to face the recording medium; and the magnetoresistance element of claim 1, and
the magnetoresistance element is configured to detect a signal magnetic field from the recording medium.

6. A magnetic recording device comprising:
a recording medium;
a thin-film magnetic head; and
a positioning device supporting the thin-film magnetic head and positioning the thin-film magnetic head with respect to the recording medium, wherein
the thin-film magnetic head includes: a medium facing surface facing the recording medium; and the magnetoresistance element of claim 1, and
the magnetoresistance element is configured to detect a signal magnetic field from the recording medium.

* * * * *